United States Patent
Son et al.

(10) Patent No.: US 8,236,673 B2
(45) Date of Patent: Aug. 7, 2012

(54) METHODS OF FABRICATING VERTICAL SEMICONDUCTOR DEVICE UTILIZING PHASE CHANGES IN SEMICONDUCTOR MATERIALS

(75) Inventors: Yong-hoon Son, Yongin-si (KR); Jin-ha Jeong, Yongin-si (KR); Jung-ho Kim, Suwon-si (KR); Vladimir Urazaev, Suwon-si (KR); Jong-hyuk Kang, Seoul (KR); Sung-woo Hyun, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/024,924

(22) Filed: Feb. 10, 2011

(65) Prior Publication Data
US 2011/0217828 A1    Sep. 8, 2011

(30) Foreign Application Priority Data
Mar. 5, 2010    (KR) .................. 10-2010-0020062

(51) Int. Cl.
*H01L 21/20*    (2006.01)
(52) U.S. Cl. ........................ 438/486; 438/259
(58) Field of Classification Search .................. 438/486, 438/478, 487, 264, 257, 259
See application file for complete search history.

(56) References Cited

U.S. PATENT DOCUMENTS
2007/0158736 A1* 7/2007 Arai et al. .................. 257/315
2010/0224929 A1* 9/2010 Jeong et al. ................ 257/324

FOREIGN PATENT DOCUMENTS
JP    10-093083 A    4/1998
KR    1020060012182 A    2/2006
KR    1020080040824 A    5/2008

* cited by examiner

*Primary Examiner* — Charles Garber
*Assistant Examiner* — Reema Patel
(74) *Attorney, Agent, or Firm* — Myers Bigel Sibley & Sajovec, P.A.

(57) ABSTRACT

A method of fabricating a vertical NAND semiconductor device can include changing a phase of a first preliminary semiconductor layer in an opening from solid to liquid to form a first single crystalline semiconductor layer in the opening and then forming a second preliminary semiconductor layer on the first single crystalline semiconductor layer. The phase of the second preliminary semiconductor layer is changed from solid to liquid to form a second single crystalline semiconductor layer that combines with the first single crystalline semiconductor layers to form a single crystalline semiconductor layer in the opening.

20 Claims, 23 Drawing Sheets

METHODS OF FABRICATING VERTICAL SEMICONDUCTOR DEVICE UTILIZING PHASE CHANGES IN SEMICONDUCTOR MATERIALS

CROSS-REFERENCE TO RELATED APPLICATIONS

This application claims the benefit of Korean Patent Application No. 10-2010-0020062, filed on Mar. 5, 2010, in the Korean Intellectual Property Office, the disclosure of which is incorporated herein in its entirety by reference.

BACKGROUND

The inventive concept relates to a method of fabricating a vertical semiconductor device, and more particularly, to a method of fabricating a vertical semiconductor device including a single crystalline semiconductor layer.

Semiconductor devices may be variously employed for electronic and communication products. To increase the integration density of the semiconductor devices, a vast amount of research has been conducted on methods of stacking cell transistors included in a single chip in a vertical direction. In particular, since a single cell can include a single transistor in a NAND flash memory device, cell transistors may be vertically stacked so that the cell transistors can be more highly integrated. However, when cell transistors included in a semiconductor device are stacked in a vertical direction, it may be difficult to provide uniform operating characteristics for the cell transistors.

When active regions of the cell transistors are formed of a polysilicon layer, cell dispersion may be lower than when the active regions of the cell transistors are formed of a single crystalline semiconductor layer, and an on-current may be reduced which may decrease the operating speed of the semiconductor devices. Furthermore, when the active regions of the cell transistors are formed of the polysilicon layer, a tunnel oxide layer included in the cell transistors should be formed using a chemical vapor deposition (CVD) process.

SUMMARY

It should be appreciated that this Summary is provided to introduce a selection of concepts in a simplified form, the concepts being further described below in the Detailed Description. This Summary is not intended to identify key features or essential features of this disclosure, nor is it intended to limit the scope of the disclosure.

According to an aspect of the inventive concept, there is provided a method of fabricating a vertical semiconductor device including forming a stack structure on a substrate. The stack structure has openings exposing a top surface of the substrate. A first preliminary semiconductor layer is formed in partial regions of the openings of the stack structure. The first preliminary semiconductor layer is primarily phase-changed to form a first single crystalline semiconductor layer in the partial regions of the openings. A second preliminary semiconductor layer is formed on the first single crystalline semiconductor layer. The second preliminary semiconductor layer is secondarily phase-changed to form a second single crystalline semiconductor layer and combine the first and second single crystalline semiconductor layers into a single crystalline semiconductor layer.

In some embodiments according to the inventive concept, a method of fabricating a vertical NAND semiconductor device includes changing a phase of a first preliminary semiconductor layer in an opening from solid to liquid to form a first single crystalline semiconductor layer in the opening and then forming a second preliminary semiconductor layer on the first single crystalline semiconductor layer. The phase of the second preliminary semiconductor layer is changed from solid to liquid to form a second single crystalline semiconductor layer that combines with the first single crystalline semiconductor layers to form a single crystalline semiconductor layer in the opening.

In some embodiments according to the inventive concept, changing the phase can be provided by heating the first or second preliminary semiconductor layer to a melting point of silicon using laser light.

In some embodiments according to the inventive concept, changing the phase can be provided by heating the first or second preliminary semiconductor layer in a furnace at a temperature of about 600 to about 700 degrees Centigrade for several hours.

Other methods and devices according to embodiments of the inventive concept will be or become apparent to one with skill in the art upon review of the following drawings and detailed description. It is intended that all such additional methods and/or devices be included within this description, be within the scope of the present inventive concept, and be protected by the accompanying claims.

DETAILED DESCRIPTION OF THE EMBODIMENTS

Figure 1:
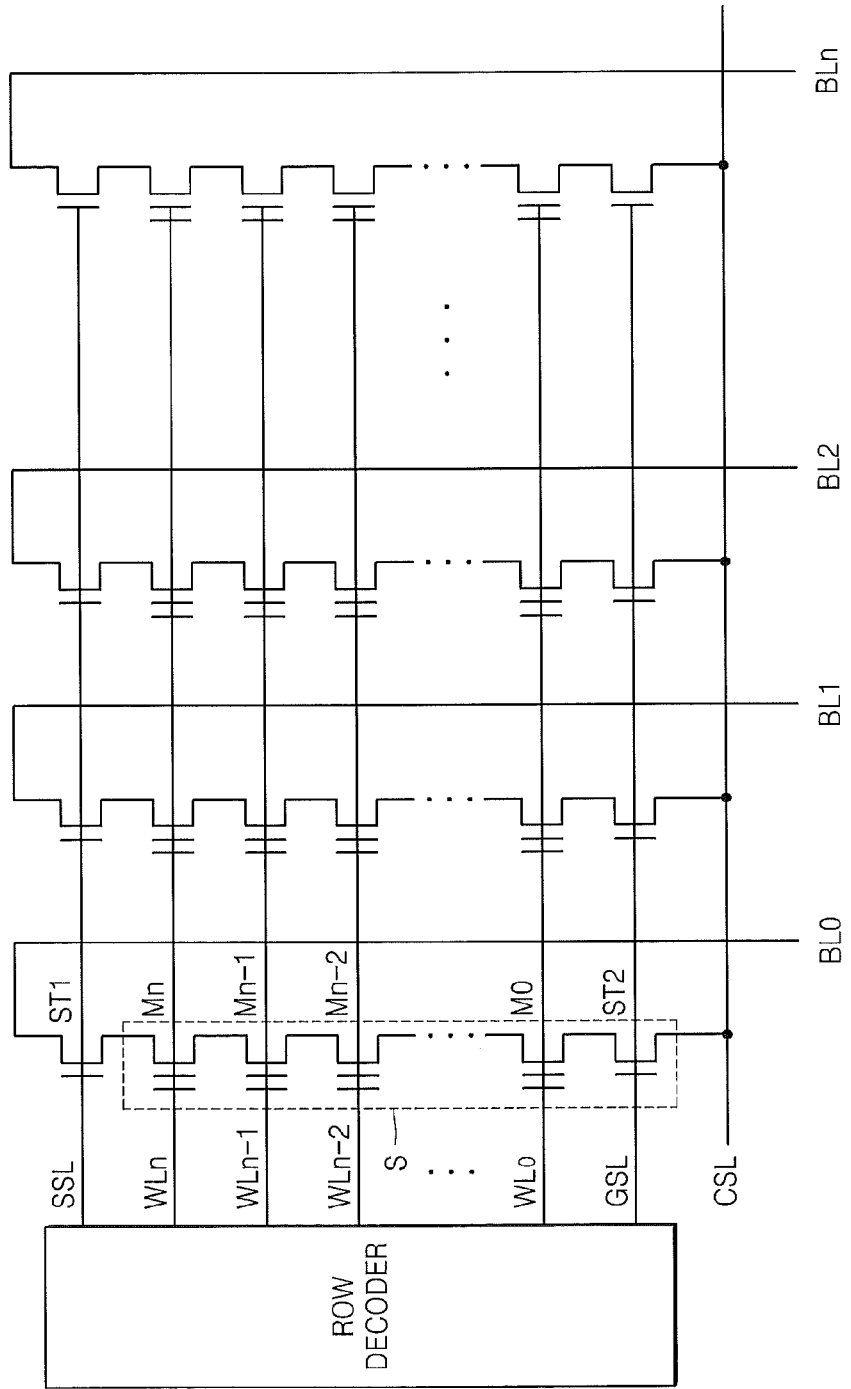
FIGS. 1 and 2 are circuit diagrams of a vertical non-volatile semiconductor memory device according to an embodiment of the inventive concept.

The present inventive concept will now be described more fully with reference to the accompanying drawings, in which embodiments of the inventive concept are shown. The inventive concept may, however, be embodied in many different forms and should not be construed as being limited to the embodiments set forth herein; rather, these embodiments are provided so that this disclosure will be thorough and complete, and will fully convey the inventive concept to those skilled in the art. In the drawings, the thicknesses of layers and regions are exaggerated for clarity. Like reference numerals in the drawings denote like elements, and thus their description will be omitted.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, a semiconductor memory device, for example, a vertical non-volatile semiconductor memory device will be described as one type of vertical semiconductor device. Even if power supply is abruptly interrupted, the vertical non-volatile semiconductor memory device may retain stored data. Specifically, a NAND flash memory device will be described as an example of the vertical non-volatile semiconductor memory device. Thus, the following description may exactly apply to a NAND flash memory device.

In some embodiments according to the inventive concept, a first preliminary semiconductor layer is phase-changed, thereby forming a first single crystalline semiconductor layer in a portion of a first opening. The phase-change of the first preliminary semiconductor layer may be created by annealing using, for example, a laser-induced epitaxial growth (LEG) process, a solid-phase epitaxy (SPE) process, or a metal induced crystallization (MIC) process using a metal catalyst. A temperature of about 600 to about 700 degrees Centigrade can be applied for several hours by a furnace so that amorphous silicon may can be melted (ie. change from a solid phase to a liquid phase, which can then be crystallized using an underlying crystal layer as a seed layer.

For example, laser beams used during the LEG process can be applied at an energy density sufficient to completely melt the first preliminary semiconductor layer. More specifically, the first preliminary semiconductor layer may be melted by the laser light so that amorphous silicon or crystalline silicon is changed from a solid phase to a liquid phase. In particular, a top surface of the first preliminary semiconductor layer through to the top surface of the underlying substrate at the bottom surfaces of the first openings may be changed into a liquid phase. In this case, laser beams may be heat the first preliminary semiconductor layer to a temperature of about 1,410 degrees Centigrade.

Thus, single crystals of the substrate may function as seeds for the liquid amorphous or crystalline silicon. As a result, the first preliminary semiconductor layer may be changed into a single crystalline structure. For example, an excimer laser may be used. Also, the laser may have a scannable structure to enable laser light to be impinged in a short amount of time.

Figure 2:
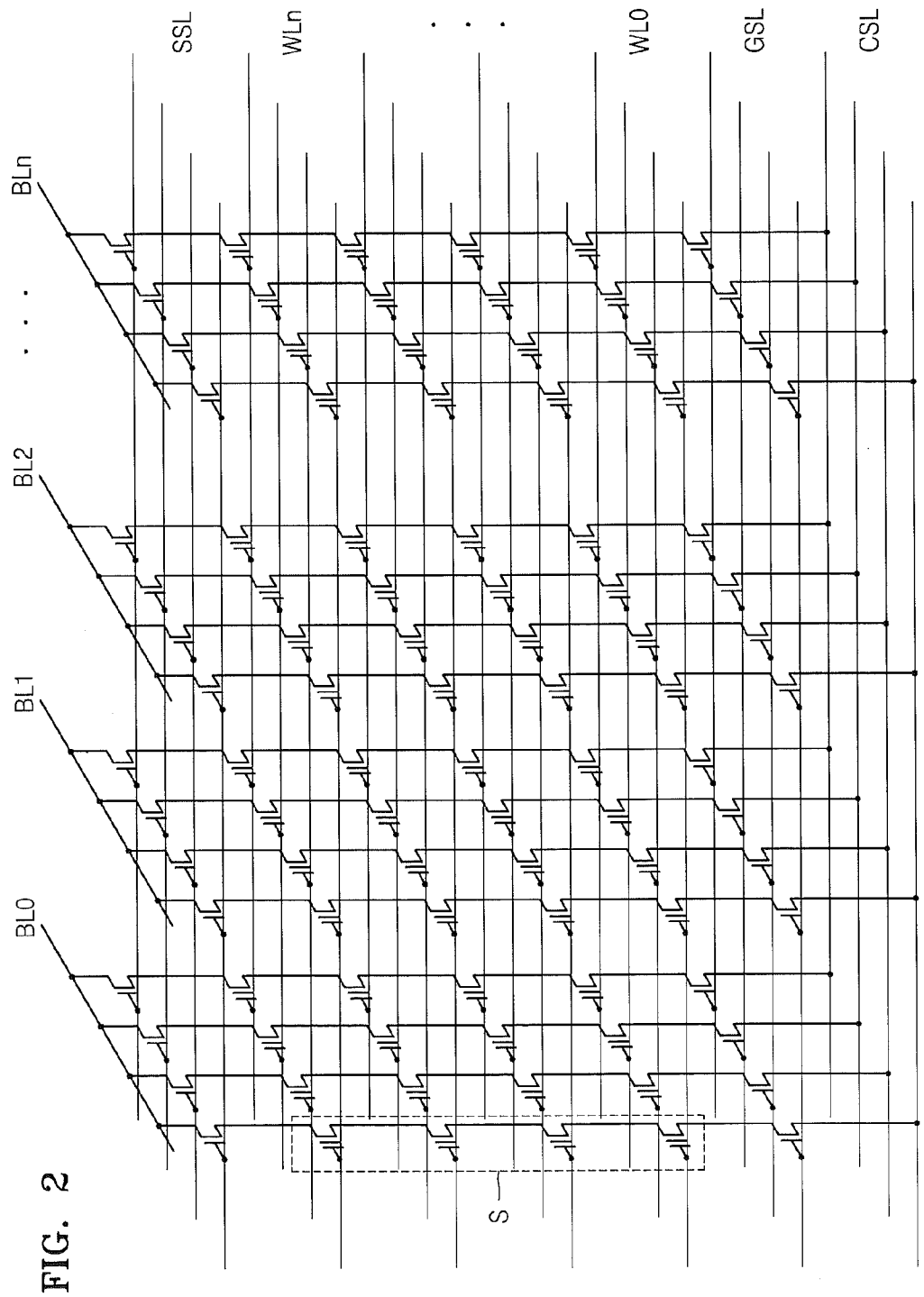

FIGS. 1 and 2 are circuit diagrams of a vertical non-volatile semiconductor memory device according to an embodiment of the inventive concept.

Specifically, FIGS. 1 and 2 represent 2- and 3-dimensional depictions of the vertical non-volatile semiconductor memory device, that is, a vertical NAND flash memory device. A non-volatile semiconductor memory device may include N cell transistors M0 to Mn, which are connected in series to form a unit cell string S, and the unit cell strings S may be connected in parallel between bit lines BL0 to BLn and a ground selection line GSL.

The vertical non-volatile semiconductor memory device according to the present embodiment may include cell strings S each formed by cell transistors M0 to Mn connected in series, word lines WL0 to WLn configured to select the cell transistors M0 to Mn, a row decoder configured to drive the word lines WL0 to WLn, a string selection line SSL connected to one terminal of the cell string S and including a string selection transistor ST1, bit lines BL0 to BLn connected to a drain of the string selection transistor ST1, and a ground selection line GSL connected to the other terminal of the cell string S and including a ground selection transistor ST2. Also, a common source line CSL may be connected to a source of the ground selection transistor ST2.

The vertical non-volatile semiconductor memory device may constitute a unit cell string that includes the cell string S, the string selection transistor ST1 and the ground selection transistor ST2, which are connected to the top and bottom of the cell string S. Although FIGS. 1 and 2 illustrate that a single string selection transistor ST1 and a ground selection transistor ST2 are connected to the cell string S to constitute the unit cell string, the unit cell string may include at least two string selection transistors ST1 and at least two ground selection transistors ST2. The following description will be presented using a unit cell string including a cell string S.

Figure 3:
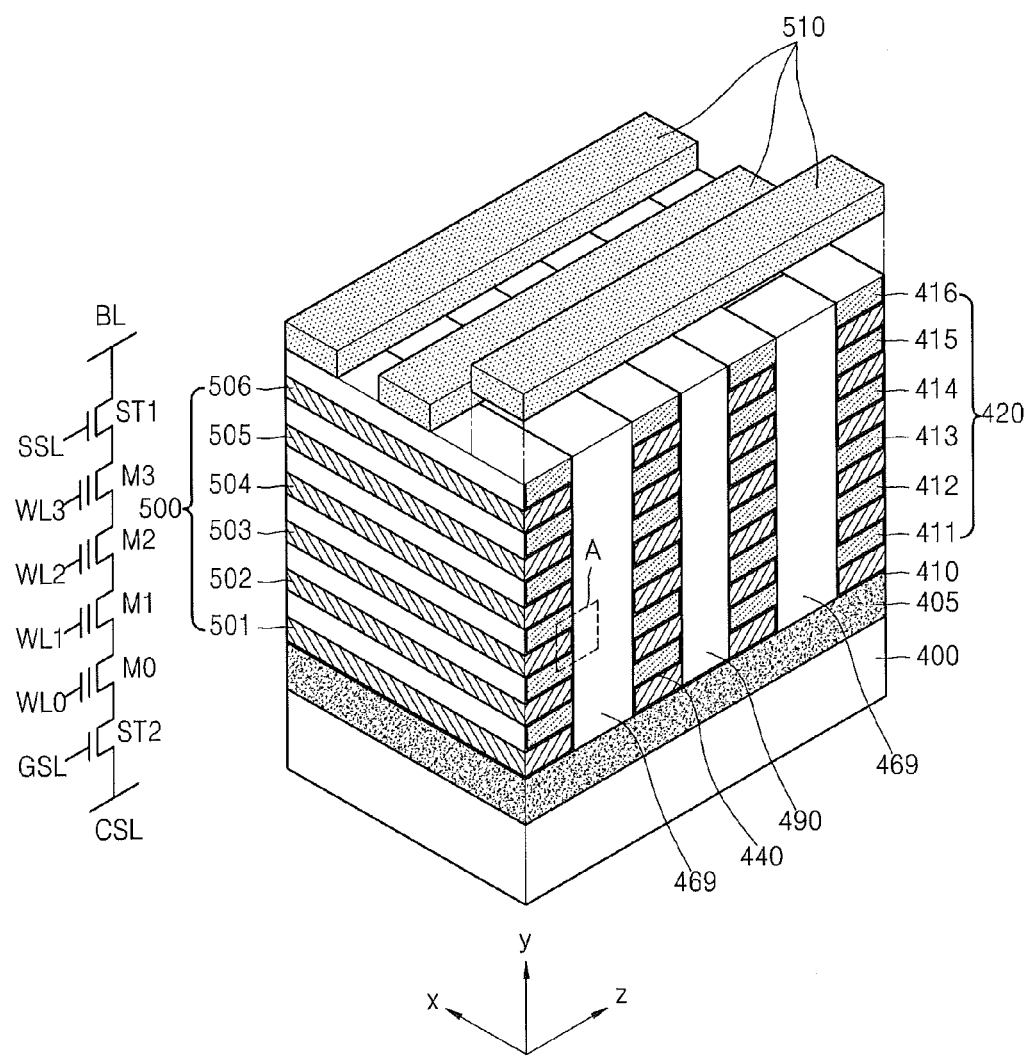
FIG. 3 is a perspective view of a vertical non-volatile semiconductor memory device according to an embodiment of the inventive concept.
Figure 4:
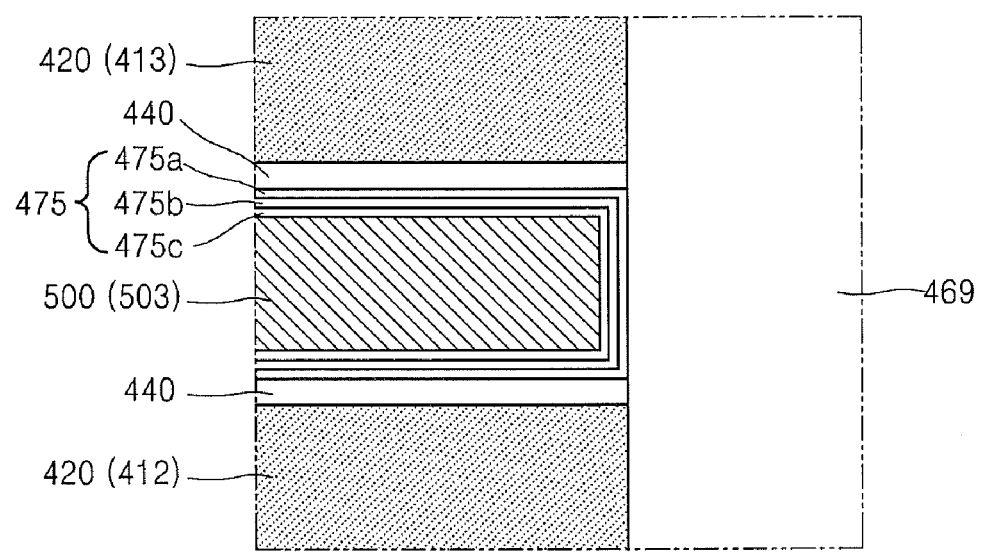
FIG. 4 is an enlarged cross-sectional view of a portion "A" of the vertical non-volatile semiconductor memory device of FIG. 3.

FIG. 3 is a perspective view of a vertical non-volatile semiconductor memory device according to an embodiment of the inventive concept, and FIG. 4 is an enlarged cross-sectional view of a portion "A" of the vertical non-volatile semiconductor memory device of FIG. 3.

Referring to FIGS. 3 and 4, a substrate 400 may be formed of, e.g., a single crystalline semiconductor material. The substrate 400 may be, for example, a single crystalline silicon substrate. The single crystalline silicon substrate may be a single crystalline silicon wafer, for example, a p-type single crystalline silicon wafer. An impurity region 405 functioning as a common source line CSL may be disposed under the top surface of the substrate 400. The impurity region 405 may be doped with N-type impurities.

The impurity region 405 may be disposed to connect lower portions of respective cell strings formed in cylindrical or pillar-type single crystalline semiconductor patterns 469. The single crystalline semiconductor patterns 469 may be formed on the substrate 400. The single crystalline semiconductor patterns 469 may be at equal intervals spaced apart from each other and repetitively extend in a first direction, namely, an X-direction. The single crystalline semiconductor patterns 469 may have sidewalls with a slope of approximately 90° (that is essentially vertical in the Y direction).

The single crystalline semiconductor pattern 469 may be formed of, for example, a single crystalline silicon layer. The single crystalline semiconductor pattern 469 may provide an active region of the vertical non-volatile semiconductor memory device. The single crystalline semiconductor pattern 469 may be formed without voids by using the following method of forming a semiconductor structure.

In some embodiments according to the inventive concept, the formation of the single crystalline silicon layer forming the single crystalline semiconductor pattern 469 may be provided by phase-changing a crystalline silicon layer or an amorphous silicon layer using a furnace thermal process, a laser-induced epitaxial growth (LEG) process, a solid phase epitaxy (SPE) process, or a metal induced crystallization (MIC) process using a metal catalyst. Alternatively, the formation of the single crystalline silicon layer forming the single crystalline semiconductor pattern 469 may be provided by a selective epitaxy growth (SEG) process using the substrate 400 as a seed layer.

Transistors may be disposed on sidewalls of the single crystalline semiconductor patterns 469. The transistors may include a ground selection transistor ST2, cell transistors M0 to Mn, and a string selection transistor ST1. The cell transistors M0 to Mn formed in the respective cylindrical single crystalline semiconductor patterns 469 may form a single cell string S. The transistors may be connected in series along the single crystalline semiconductor patterns 469 in a vertical direction (i.e., the Y-direction).

In general, $2^m$ cell transistors M0 to M3 (here, m is a natural number equal to or greater than 1) may be formed in the single cell string S formed on the substrate 400. In some embodiments according to the inventive concept, 2, 4, 8, or 16 cell transistors M0 to Mn may be connected in series in the single cell string S. Although FIG. 3 illustrates four cell transistors M0 to M3 connected in series, for brevity, the single cell string S may include a greater number of cell transistors. Also, although FIG. 3 illustrates that the string selection transistor ST1 and the ground selection transistor ST2 are included in one cell string S to constitute a unit cell string, the single cell string S may include at least two string selection transistors ST1 or at least two ground selection transistors ST2.

Interlayer insulating patterns 420 may be disposed to contact both opposing sidewalls of the single crystalline semiconductor patterns 469. The interlayer insulating patterns 420 may be spaced apart from each other by a predetermined distance in the Y-direction and have a linear shape extending in the first direction (i.e., X-direction). That is, the interlayer insulating patterns 420 may be linear shaped and parallel with one another in the Y-direction. Also, the interlayer insulating patterns 420 may be formed in parallel with the X-Z plane at equal intervals. The interlayer insulating patterns 420 may be in contact with the single crystalline semiconductor patterns 469. The transistors may be disposed in concave portions between the interlayer insulating patterns 420. Thus, the interlayer insulating patterns 420 may serve to define regions where transistors will be formed. Also, the interlayer insulating patterns 420 may electrically insulate gate patterns 500 formed as separate layers from one another.

A pad oxide layer 410 may be disposed on the top surface of the substrate 400, but may not contact the single crystalline semiconductor patterns 469. A first interlayer insulating layer 411 may be disposed on the pad oxide layer 410, between first and second gate patterns 501 and 502. A second interlayer insulating material layer 412 may be disposed between the second gate pattern 502 and a third gate pattern 503. First through sixth interlayer insulating material layers 411 to 416 may be formed between respective first through sixth gate patterns 501 to 506 in the same manner as described above.

The interlayer insulating patterns 420 may contact the sidewalls of the single crystalline semiconductor patterns 469 disposed adjacent to one another in a second direction (i.e., a Y direction) perpendicular to the first direction and have the shape of lines extending in the first direction. The interlayer insulating patterns 420 may be formed of an insulating material having an etch selectivity with respect to silicon nitride and the single crystalline semiconductor patterns 469. The interlayer insulating patterns 420 may be formed of silicon oxide. As described above, transistors may be disposed on the sidewalls of the single crystalline semiconductor patterns 469 disposed between the interlayer insulating patterns 420.

According to FIG. 4, a tunnel insulating layer 475a may be disposed on the sidewalls of the single crystalline semiconductor patterns 469. The tunnel insulating layer 475a may be formed of a tunnel oxide layer. A shielding layer 440 may be formed between the tunnel insulating layer 475a and the interlayer insulating patterns 420. The shielding layer 440 may prevent charges from spreading in a vertical direction, i.e., a Y-direction. At least portions of the tunnel insulating layer 475a, which may contact the sidewalls of the single crystalline semiconductor patterns 469, may be spaced a predetermined distance apart from one another in the vertical direction. The tunnel insulating layer 475a may discontinuously contact the sidewalls of the single crystalline semiconductor patterns 469. The tunnel insulating layer 475a may be formed of a thermal oxide layer by thermally oxidizing the sidewalls of the single crystalline semiconductor patterns 469. Alternatively, the tunnel insulating layer 475a may be formed of silicon oxide formed using a thermal oxidation process.

Since the tunnel insulating layer 475a is formed by thermally oxidizing the portions of the single crystalline semiconductor patterns 469, the tunnel insulating layer 475a may be more highly durable than a tunnel insulating layer formed using a chemical vapor deposition (CVD) process. However, according to another embodiment, the tunnel insulating layer 475a may be formed of an oxide obtained using a CVD process. As shown, the tunnel insulating layer 475a may extend along the surfaces of the single crystalline semiconductor patterns 469 and the shielding layer 420. In this case, the tunnel insulating layers 475a formed at respective layers may be not divided but connected. According to another embodiment, although not shown, the tunnel insulating layer 475a may be disposed only on the sidewalls of the single crystalline semiconductor patterns 469, between the interlayer insulating patterns 420.

A charge storage layer 475b may be disposed on the tunnel insulating layer 475a. The charge storage layer 475b may be formed of silicon nitride or a metal oxide, which may be capable of trapping charges. In this case, charges may be stored in the charge storage layer 475b in a charge trap manner. The charge storage layer 475b may be formed of silicon nitride, which may be deposited to a thin thickness.

The charge storage layer 475b disposed at the same layer in the first direction may be connected. However, since the charge storage layer 475b is formed of an insulating material, even if the charge storage layer 475b is connected, respective transistors between which the charge storage layer 475b is shared may not be electrically connected to one another. As shown, the charge storage layers 475b formed in the single crystalline semiconductor patterns 469 may be connected in the vertical direction. The charge storage layer 475b may be connected along profiles of the sidewalls of the single crystalline semiconductor patterns 469 and top and bottom surfaces of the interlayer insulating patterns 420. Although not shown, according to another embodiment, the charge storage layers 475b formed on the single crystalline semiconductor patterns 469 may not be connected in the vertical direction.

A blocking insulating layer 475c may be disposed on the charge storage layer 475b. The blocking insulating layer 475c may be formed of silicon oxide or a metal oxide. The metal oxide may be a material having a higher dielectric constant than silicon nitride. Like the charge storage layer 475b, the blocking insulating layer 475c disposed at the same layer in the first direction may be connected in a horizontal direction.

Also, as shown, the blocking insulating layer 475c formed on the single crystalline semiconductor patterns 469 may be connected in a vertical direction. The blocking insulating layer 475c may be connected along the profiles of the sidewalls of the single crystalline semiconductor patterns 469 and the top and bottom surfaces of the interlayer insulating patterns 420. According to another embodiment, the blocking insulating layer 475c formed in the single crystalline semiconductor patterns 469 may be not connected in a vertical direction.

The cell transistors M0 to M3 may be electrically turned on and off due to a Fowler-Nordheim (F-N) tunnelling mechanism or hot electron injection. Also, a composite layer 475 including the tunnel insulating layer 475a, the charge storage layer 475b, and the blocking insulating layer 475c may function as gate insulating layers of the ground selection transistor ST2 and the string selection transistor ST1.

The gate patterns 500 may be disposed on a surface of the blocking insulating layer 475c in concave portions between the interlayer insulating patterns 420. The gate patterns 500 may include the second to fifth gate patterns 502 to 505 as control gate patterns and the first and sixth gate patterns 501 and 506 as general gate patterns. Hereinafter, the second to fifth gate patterns 502 to 505 are referred to as control gate patterns 502 to 505 and the first and sixth gate patterns 501 and 506 are referred to as general gate patterns 501 and 506. The control gate patterns 502 to 505 may serve to control the cell transistors M0 to M3, and the general first through sixth gate patterns 501 and 506 may serve to control the ground selection transistor ST2 and the string selection transistor ST1, respectively. The top and bottom surfaces and sidewalls of the gate patterns 500 may contact the blocking insulating layer 475c. The gate patterns 500 may be disposed opposite the single crystalline semiconductor patterns 469. The gate patterns 500 disposed at the same layer in the first direction may have a linear shape. The gate patterns 500 may serve as word lines WL0 to WL3, a string selection line SSL, and a ground selection line GSL. The gate patterns 500 disposed at different layers may be electrically insulated from one another by the interlayer insulating patterns 420. The gate patterns 500 may surround the single crystalline semiconductor patterns 469 by interposing the tunnel insulating layer 475a, the charge storage layer 475b, and the blocking insulating layer 475c therebetween.

Isolation insulating patterns 490 may be disposed between the interlayer insulating patterns 420 and the gate patterns 500 in the second direction. The isolation insulating patterns 490 may be formed of a silicon oxide layer. The isolation insulating patterns 490 may have a linear shape extending in the first direction. The gate patterns 500, which are respectively formed on the adjacent sidewalls of the single crystalline semiconductor patterns 469, may be electrically insulated from one another by the isolation insulating patterns 490.

Bit lines 510 may be disposed to electrically connect the top surfaces of the single crystalline semiconductor patterns 469. As shown, since the bit lines 510 are directly connected to the top surfaces of the single crystalline semiconductor patterns 469 in the present embodiment, bit line contact plugs may be omitted. According to another embodiment, bit line contact plugs may be disposed to contact the top surfaces of the single crystalline semiconductor patterns 469.

The single crystalline semiconductor patterns 469 may be completely doped with N-type impurities. In this case, transistors including the cell transistors M0 to M3, the string selection transistor ST1, and the ground selection transistor ST2 may be turned on in a standby mode and turned off due to a voltage applied to the gate patterns 500. However, alternatively, source and drain regions (not shown) doped with N-type impurities may be located under the sidewalls of the single crystalline semiconductor patterns 469 that contact the interlayer insulating patterns 420. Also, channel regions or channel doping regions (not shown) doped with P-type impurities having an opposite conductivity type to the source and drain regions may be located in the single crystalline semiconductor patterns 469 extending between the tunnel insulating layer 475a on the upper and lower walls of the gate pattern.

In the above-described non-volatile semiconductor memory device, the pillar-type or cylindrical single crystalline semiconductor pattern 469 may include one unit cell string. Since the single crystalline semiconductor patterns 469 have sidewalls with a slope of approximately 90°, the integration density of the non-volatile semiconductor memory device may be further increased. As described in more detail later, the single crystalline semiconductor patterns 469 may be reliably formed without voids by using the method of forming a semiconductor structure.

Figure 13:
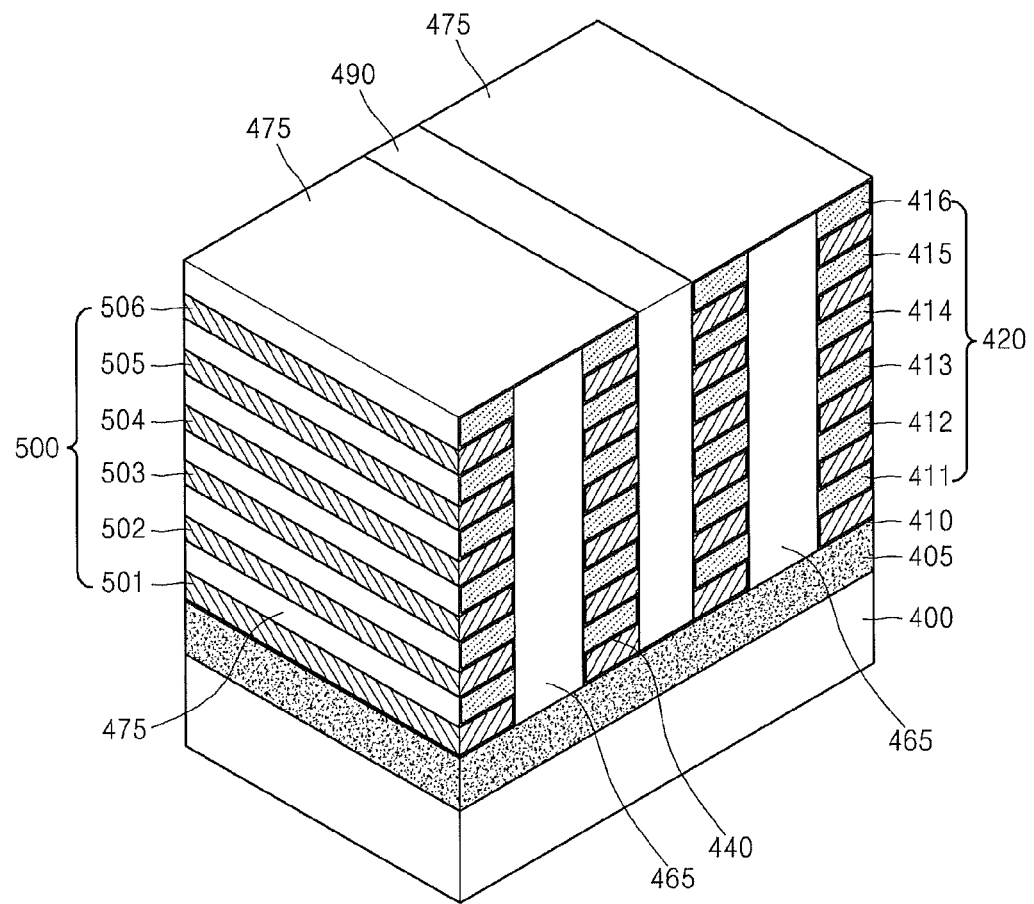
Figure 14:
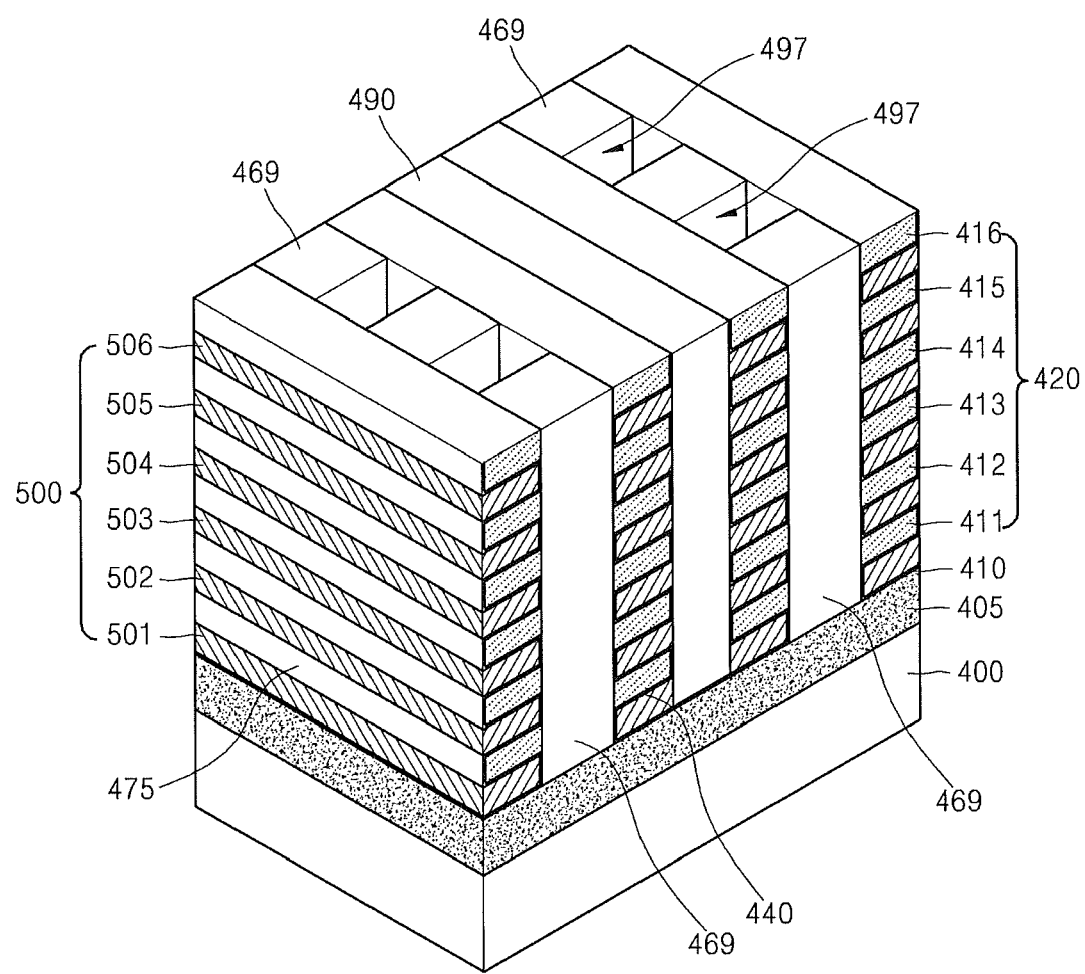
Figure 15:
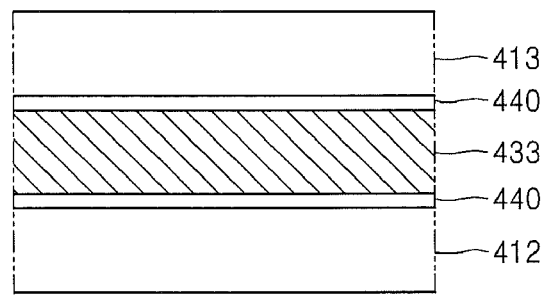
FIG. 15 is an enlarged cross-sectional view of a portion "B" of FIG. 5.

FIGS. 5 through 14 are perspective views illustrating a method of fabricating a vertical non-volatile semiconductor memory device, according to an embodiment of the inventive concept, FIG. 15 is an enlarged cross-sectional view of a portion "B" of FIG. 5, FIGS. 16 through 20 are cross-sectional views illustrating a method of forming a semiconductor structure, according to an embodiment of the inventive concept, and FIGS. 21 through 25 are cross-sectional views illustrating a method of forming a semiconductor structure according to another embodiment of the inventive concept.

Figure 5:
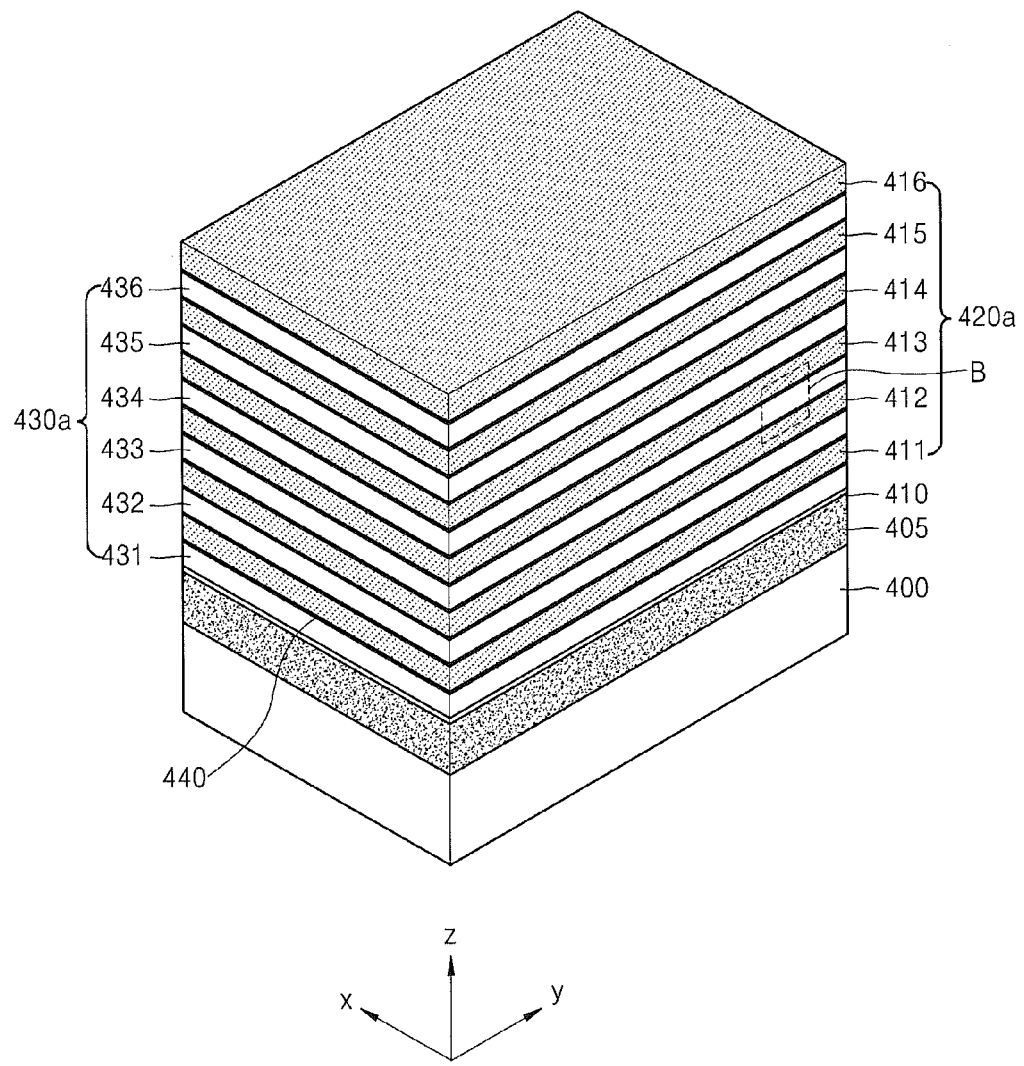
FIGS. 5 through 14 are perspective views illustrating a method of fabricating a vertical non-volatile semiconductor memory device, according to an embodiment of the inventive concept.

Referring to FIGS. 5 and 15, a substrate 400 may be prepared. The substrate 400 may be formed of single crystalline silicon. The substrate 400 may be a single crystalline silicon wafer. A surface region of the substrate 400 may be doped with N-type impurities, thereby forming an impurity region 405 functioning as a common source line of a NAND flash memory device. The formation of the impurity region 405 may include doping N-type impurities under the top surface of the substrate 400 where one cell block is formed.

A pad oxide layer 410 may be formed on the substrate 400 having the impurity region 405. The formation of the pad oxide layer 410 may include thermally oxidizing the substrate 400 or depositing an oxide using a CVD process. The pad oxide layer 410 may be provided to inhibit the generation of stress during a direct contact of a sacrificial material layer 430a (formed of silicon nitride) with the substrate 400. First through sixth sacrificial material layers 431 to 436 and first through sixth interlayer insulating material layers 411 to 416, which respectively constitute sacrificial layers 430a and an interlayer insulating layer 420a, may be alternately stacked on one another on the pad oxide layer 410. The sacrificial layer 430a and the interlayer insulating layers 420a may be formed using a CVD process.

The sacrificial layers 430a may be formed of a material having an etch selectivity with respect to the interlayer insulating layers 420a and single crystalline silicon. Also, the sacrificial layers 430a may be formed of a material that may be easily removed using a wet etching process. In the present embodiment, the sacrificial layers 430a may be formed of silicon nitride, and the interlayer insulating layers 420a may be formed of silicon oxide.

In the present embodiment, the first sacrificial material layer 431 may be disposed at the lowermost portion of the stacked structure, while the sixth interlayer insulating material layer 416 may be disposed at the uppermost portion thereof. Portions of the sacrificial layers 430a may be removed during a subsequent process to define regions where respective gate patterns will be formed. Thus, the sacrificial layers 430a may be formed to a thickness equal to or greater than the effective thickness of each of the gate patterns.

Since the gate patterns may be formed in the portions from which the sacrificial layers 430a are removed, the sacrificial layers 430a and the interlayer insulating layers 420a may be stacked in a number equal to or greater than the number of transistors included in a unit cell string. In the present embodiment, since 6 transistors are connected to one unit cell string, the first through sixth sacrificial material layers 431 to 436 and the first through sixth interlayer insulating material layers 411 to 416 may be alternately stacked as shown. Also, when one unit cell string includes a greater number of transistors than 6, a greater number of sacrificial material layers and a greater number of interlayer insulating material layers may be further stacked to form the sacrificial layers 430a and the interlayer insulating layers 420a, respectively.

In the present embodiment, as shown in FIG. 15, shielding layers 440 may be formed on top and bottom surfaces of the second sacrificial material layer 433 of the sacrificial layers 430a. In the present embodiment, as shown in FIG. 15, shielding layers 440 may be formed between the first through sixth sacrificial material layers 431 to 436 and first through sixth interlayer insulating material layers 411 to 416 since for example, a shielding layer 440 is formed between the first sacrificial material layer 433 and the first interlayer insulating material layer 412. The shielding layers 440 may be formed to reduce the likelihood of charges from spreading during operation of the non-volatile semiconductor memory device.

Figure 6:
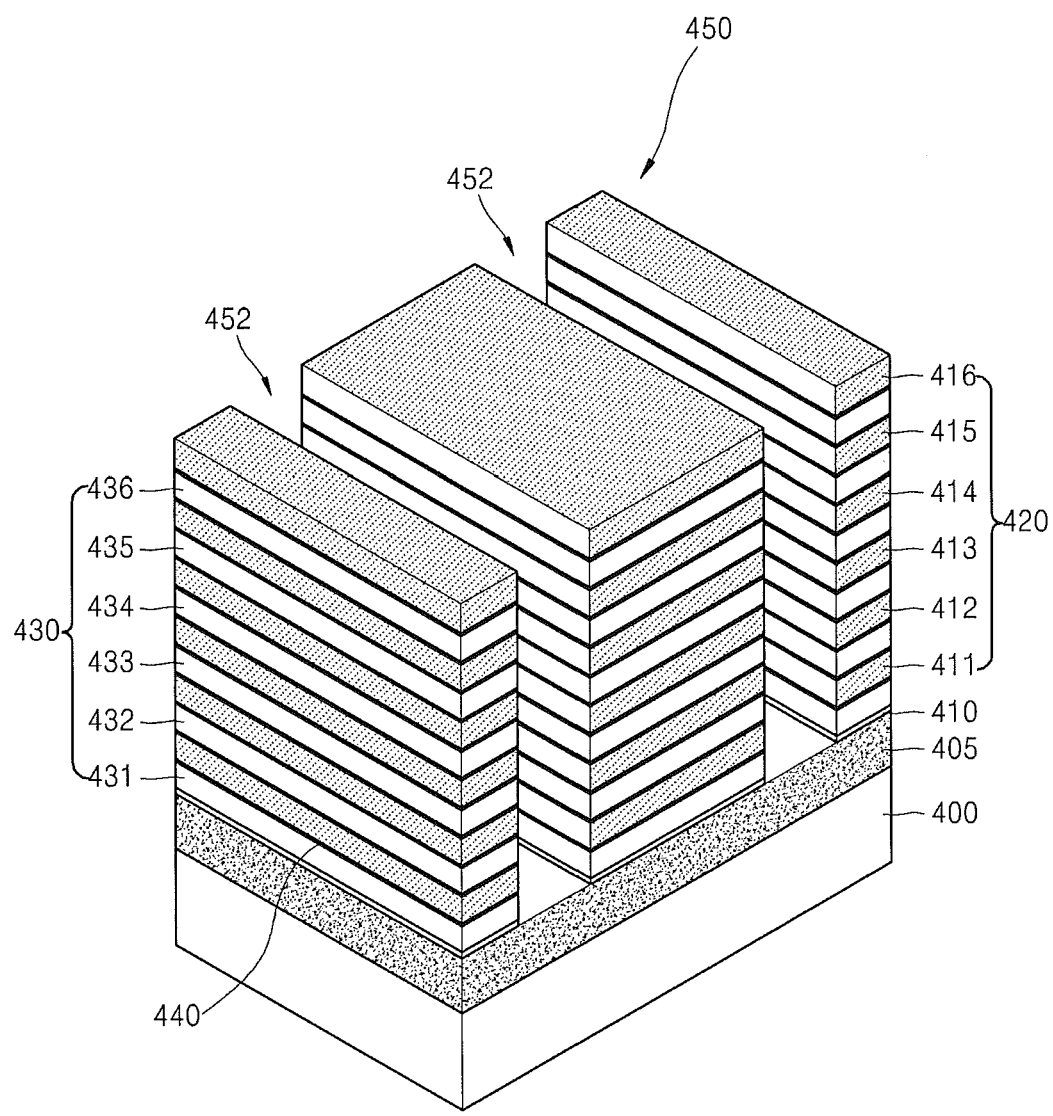

Referring to FIG. 6, first photoresist patterns (not shown) may be formed on the sixth interlayer insulating material layer 416, which is the uppermost interlayer insulating material layer. The first photoresist patterns may have a linear shape extending in the X direction. The sacrificial layers 430a and the interlayer insulating layers 420a may be sequentially etched by using the first photoresist patterns as etch masks, thereby forming a stack structure 450 including a plurality of first openings 452 that extend in the X direction.

The stack structure 450 may include sacrificial patterns 430 and interlayer insulating patterns 420. The stack structure 450 may have the form of lines extending in the first direction. In this case, the top surface of the substrate 400 may be exposed at a bottom surface of each of the first openings 452. The pad oxide layer 410 or the first sacrificial material layer 431 may partially remain without exposing the top surface of the substrate 400. The first openings 452 may be formed to the minimum thickness that may be obtained using a photolithography process. Subsequently, pillar-type or cylindrical single crystalline semiconductor patterns may be formed in the first openings 452.

Figure 7:
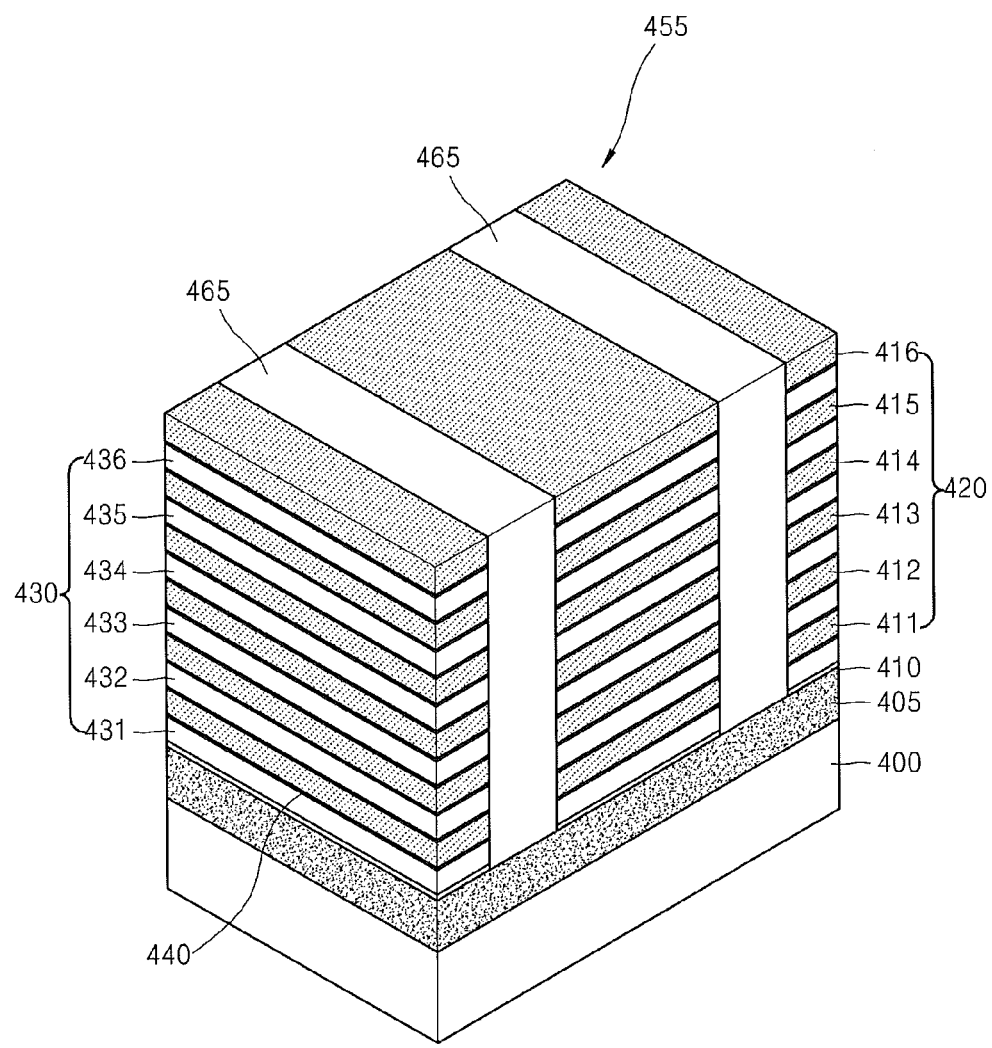

Referring to FIG. 7, a single crystalline semiconductor layer 465 may be formed on the substrate 400 in each of the first openings 452. Thus, a semiconductor structure 455 including the single crystalline semiconductor layer 465 may be formed.

Hereinafter, a method of fabricating a vertical non-volatile semiconductor memory device will be described with reference to FIG. 8. For brevity, the processes shown in FIGS. 8 through 14 will be described with reference to the semiconductor structure 455 of FIG. 7.

Figure 8:
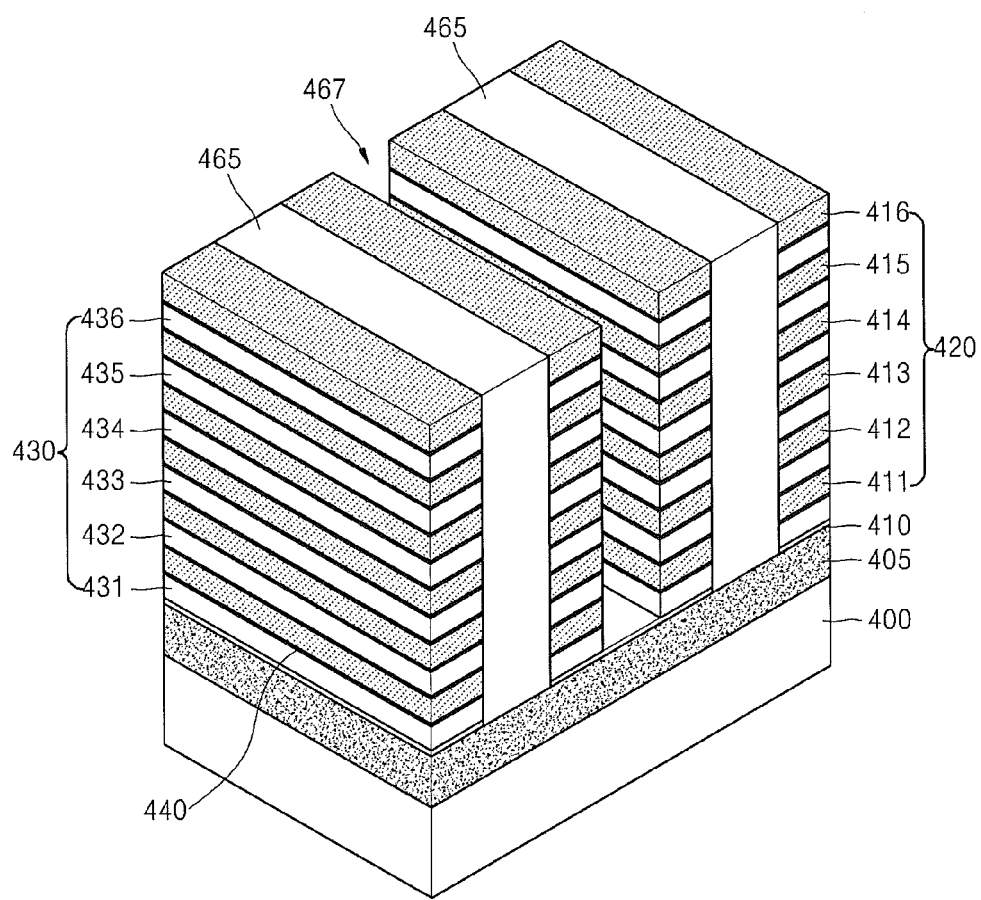

Referring to FIG. 8, second photoresist patterns (not shown) may be formed on the single crystalline semiconductor layer 465, the sacrificial patterns 430, and the interlayer insulating patterns 420 to expose portions of a stack structure between the single crystalline semiconductors 465. The portions exposed by the second photoresist patterns may have a linear shape extending in the X direction.

Next, respective layers of the stack structure may be sequentially etched using the second photoresist patterns as an etch mask, thereby forming second openings 467. The interlayer insulating patterns 420 and the sacrificial patterns 430, which are included in the stack structure 450, may be sequentially etched. The second openings 467 formed using the above-described process may extend in the X direction.

Figure 9:
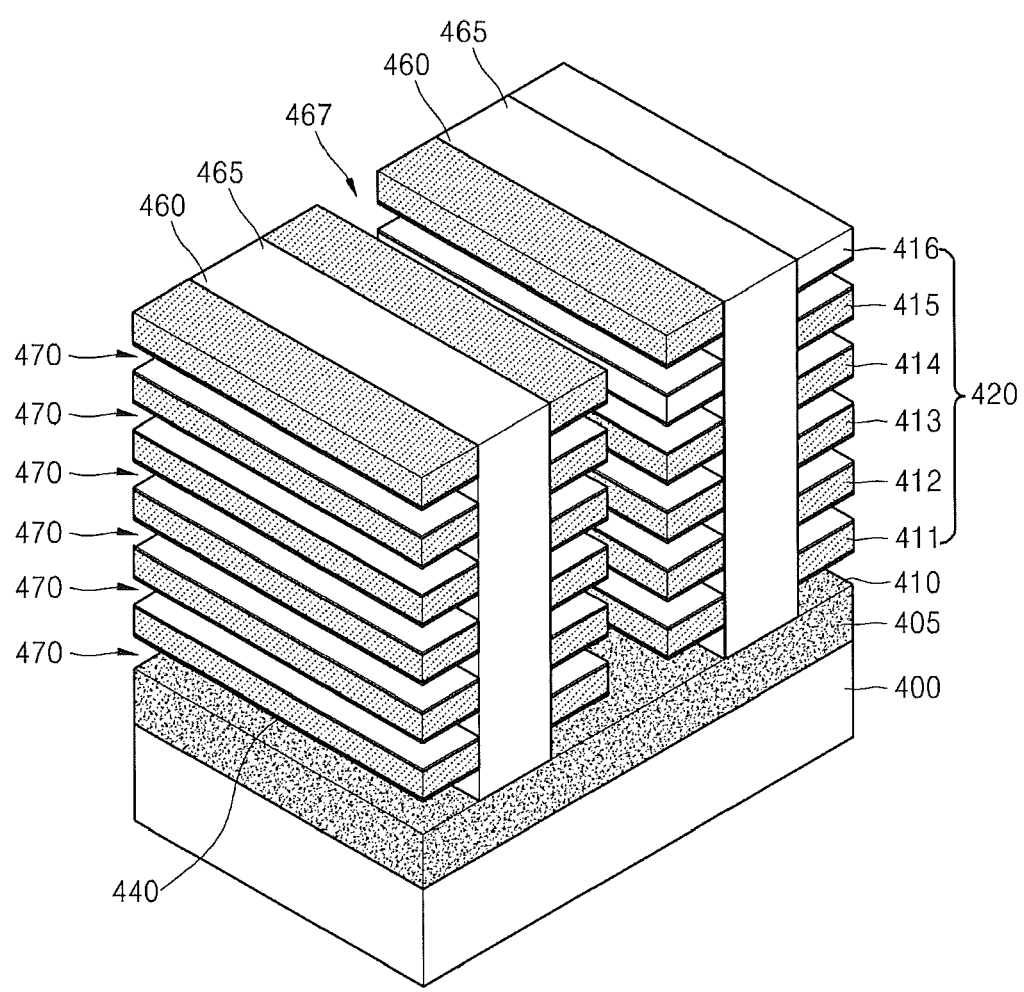

Referring to FIG. 9, portions of the sacrificial patterns 430, which are exposed in sidewalls of the second openings 467, may be removed using a wet etching process, thereby forming concave portions 470 connected to lateral portions of the second openings 467. A sidewall of the single crystalline semiconductor layer 465 may be exposed at the bottom of the concave portions 470.

As a result, interlayer insulating patterns 420 may be formed on a sidewall of the single crystalline semiconductor layer 465 and extend in the first direction. Also, the concave portions 470 may be formed between the interlayer insulating patterns 420. Subsequently, transistors may be formed in the concave portions 470. Exposed portions of the single crystalline semiconductor layer 465 may correspond to channel regions. Also, portions of the single crystalline semiconductor layer 465, which are covered with the interlayer insulating patterns 420, may correspond to source and drain regions.

Thus, after forming the concave portions 470, p-type impurities may be implanted into the exposed portions of the single crystalline semiconductor layer 465, thereby doping channel regions. To uniformly implant impurities into the exposed sidewalls of the single crystalline semiconductor layer 465, a plasma doping process may be performed. The doped channel regions may be formed to control the threshold voltage of cell transistors. The impurity doping process for forming the doped channel regions may be omitted.

Figure 10:
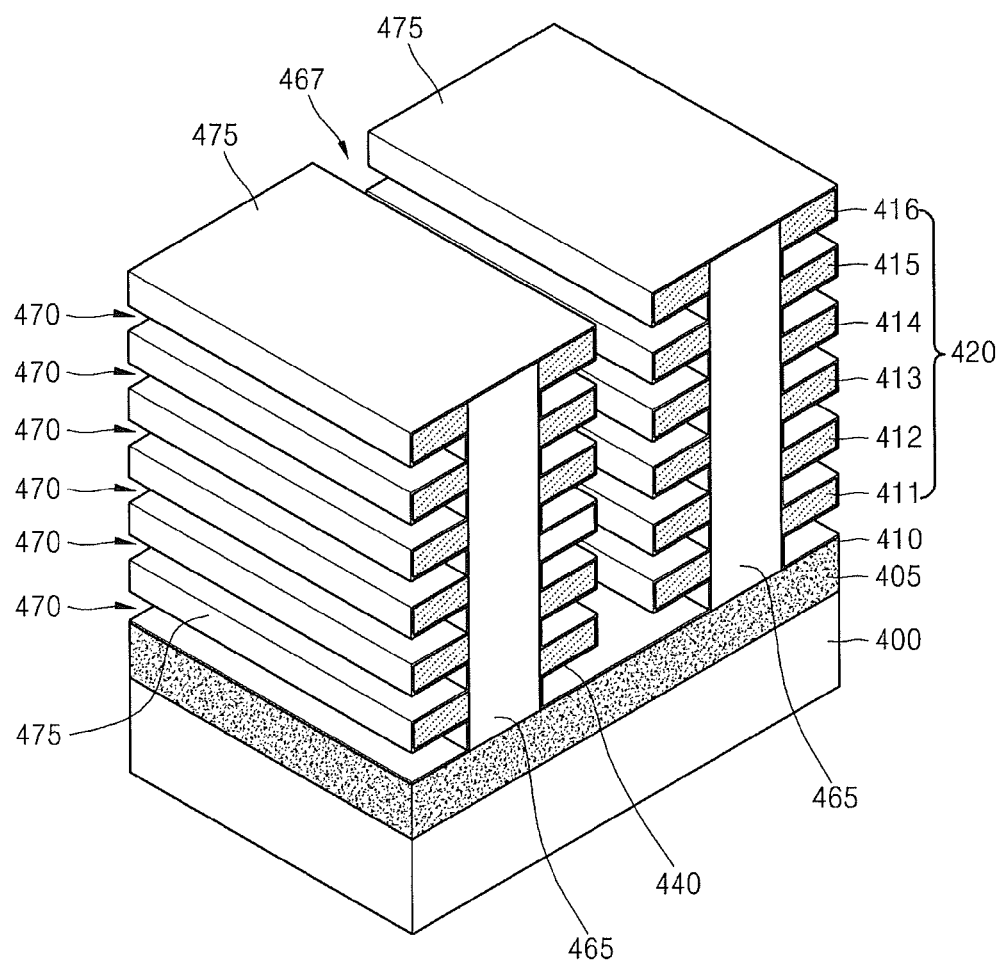

Referring to FIGS. 10 and 4, the single crystalline semiconductor layer 465 may be thermally oxidized to form a tunnel insulating layer 475a. The tunnel insulating layer 475a may be formed, e.g., of a silicon oxide layer. The tunnel insulating layer 475a may be formed using a thermal oxidation process.

According to another embodiment, the tunnel insulating layer 475a may be formed using a CVD process. As described above, the tunnel insulating layer 475a may be formed using a thermal oxidation process on the exposed sidewalls of the single crystalline semiconductor layer 465. Also, a tunnel insulating layer 475a having a relatively thin thickness may be formed on the surface of the interlayer insulating pattern 420 formed of, e.g., silicon oxide. Thus, the tunnel insulating layer 475a may be formed along the surfaces of the single crystalline silicon layer 465 and the interlayer insulating patterns 420.

According to another embodiment, by controlling the conditions of the thermal oxidation process, the tunnel insulating layer 475a may be formed not on the interlayer insulating patterns 420 but on the single crystalline semiconductor layer 465. In this case, the tunnel insulating layer 475a may be separate layers.

Next, a charge storage layer 475b may be formed along the surface of the tunnel insulating layer 475a. The charge storage layer 475b may be formed using a CVD process. The charge storage layer 475b may be formed by depositing silicon nitride or metal oxide. Since the silicon nitride and the metal oxide are insulating materials, even if the silicon nitride and the metal oxide contact each other, no electrical short may occur between the cell transistors.

Thereafter, a blocking insulating layer 475c may be formed on the surface of the charge storage layer 475b. The blocking insulating layer 475c may be formed by depositing silicon oxide or metal oxide. As a result, a composite layer 475 including the tunnel insulating layer 475a, the charge storage layer 475b, and the blocking insulating layer 475 may be formed in the concave portions 470. A shielding layer 440 configured to prevent the diffusion of charges during operation may be formed between the tunnel insulating layer 475a and the interlayer insulating patterns 420. The shielding layer 440 may be formed of aluminium nitride.

Figure 11:
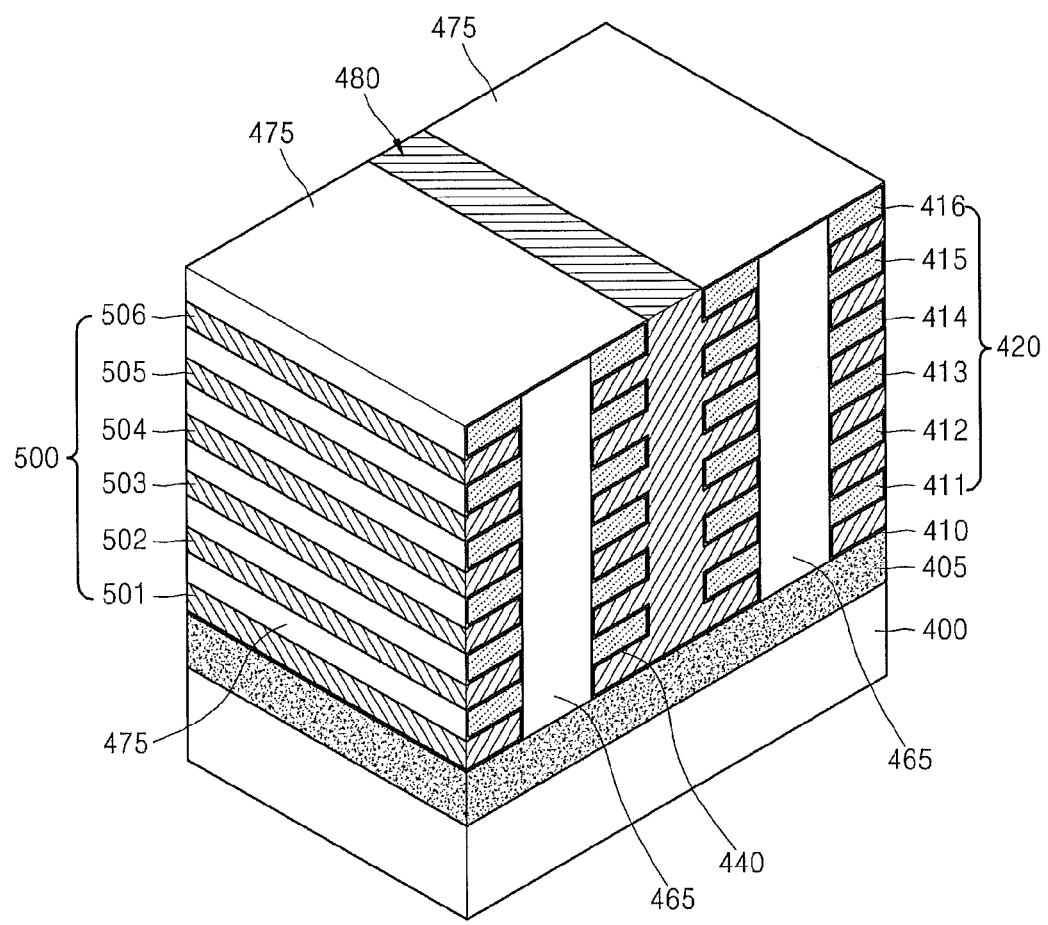

Referring to FIG. 11, a conductive layer 480 may be deposited on the blocking insulating layer 475c to completely fill the second openings 467 and the concave portions 470. The conductive layer 480 may be used as gate patterns during a subsequent process. A material having a good step coverage characteristic may be used to fill the second openings 467 and the concave portions 470 without voids. Therefore, the conductive layer 480 may be formed by depositing polysilicon doped with impurities.

As described above, in the present embodiment, the concave portions 470 defining regions where the gate patterns will be formed may be filled with a conductive material using a gate replacement process, thereby forming the gate patterns. As a result, unlike typical photolithography and etching processes for forming gate patterns, an edge of the tunnel insulating layer 475a may not be damaged during the formation of the gate patterns. Also, in the present embodiment, the formation of the gate patterns may not require a subsequent damage curing process, such as a reoxidation process.

Figure 12:
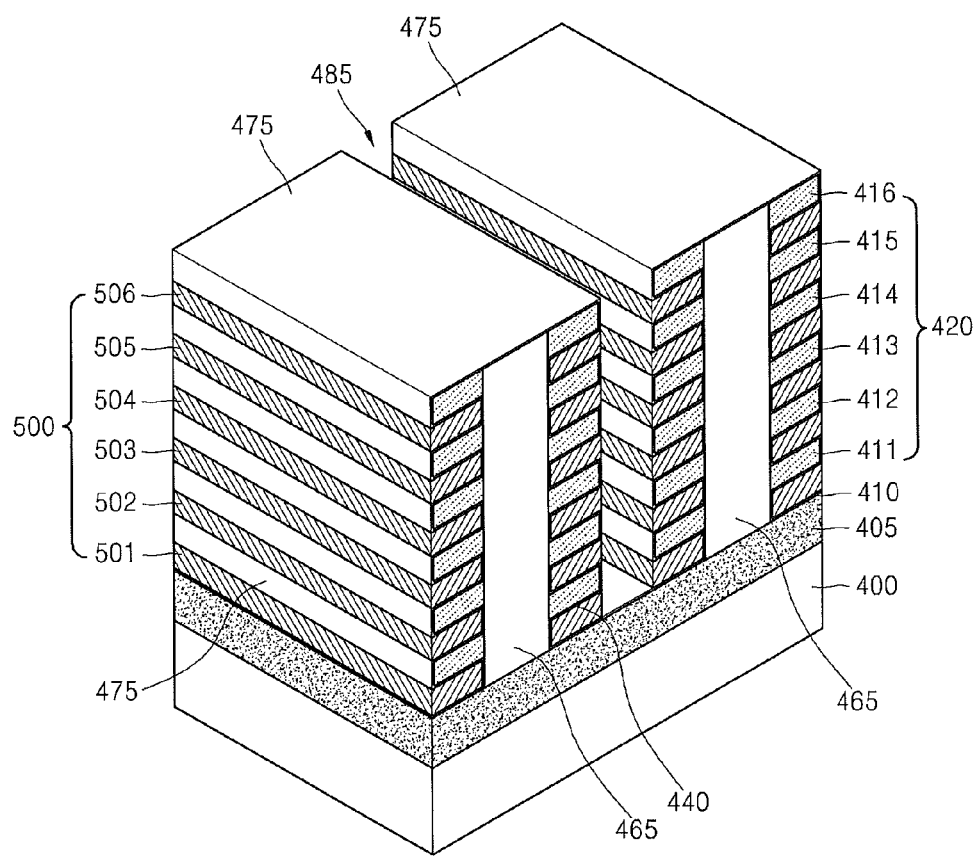

Referring to FIG. 12, third photoresist patterns (not shown) may be formed on the top surface of the resultant structure to selectively expose the top surface of the conductive layer 480 formed in the second openings 467. The exposed conductive layer 480 may be anisotropically etched using the third photoresist patterns as an etch mask, thereby forming third openings 485 to separate respective layers of the conductive layer 480 from one another in the vertical direction. The third openings 485 may have the same shape as the second openings 467.

In the above-described process, gate patterns 500 may be formed between the respective interlayer insulating patterns 420. Top and bottom surfaces and one sidewalls of the gate patterns 500 may contact the blocking insulating layer 475c. The respective gate pattern 500 may have the form of lines extending in the first direction. The gate patterns 500 formed at different layers may be electrically insulated from one another. Also, the tunnel insulating layer 475a, the charge storage layer 475b, and the blocking insulating layer 475c may not be connected to one another in the vertical direction from the top surface of the substrate 400.

Referring to FIGS. 13 and 14, a silicon oxide layer may be deposited in the third openings 485 to form an isolation insulating layer 490. Thereafter, fourth photoresist patterns (not shown) may be formed on top surfaces of the uppermost interlayer insulating material layer 416 and the isolation insulating layer 490. The fourth photoresist patterns may be formed to expose a partial region of the single crystalline semiconductor layer 465.

The single crystalline semiconductor layer 465 may be etched using the fourth photoresist patterns as an etch mask, thereby forming fourth openings 497 exposing the substrate 400. As a result, portions of the single crystalline semiconductor layer 465 may be removed, thereby forming single crystalline semiconductor patterns 469 in isolated shapes in the first direction. The single crystalline semiconductor patterns 469 may have pillar or cylindrical shapes. Also, transistors may be vertically formed only on sidewalls of the cylindrical single crystalline semiconductor patterns 469.

Subsequently, as shown in FIG. 3, bit lines 510 may be formed on the single crystalline semiconductor patterns 469 repetitively formed in the first direction to connect the single crystalline semiconductor patterns 469. As a result, the vertical non-volatile semiconductor memory device may be completely formed.

Hereinafter, a method of forming the semiconductor structure 455, according to an embodiment of the inventive concept, will be described with reference to FIGS. 16 through 20. In FIGS. 16 through 20, the shielding layer 440 is omitted for brevity.

Figure 16:
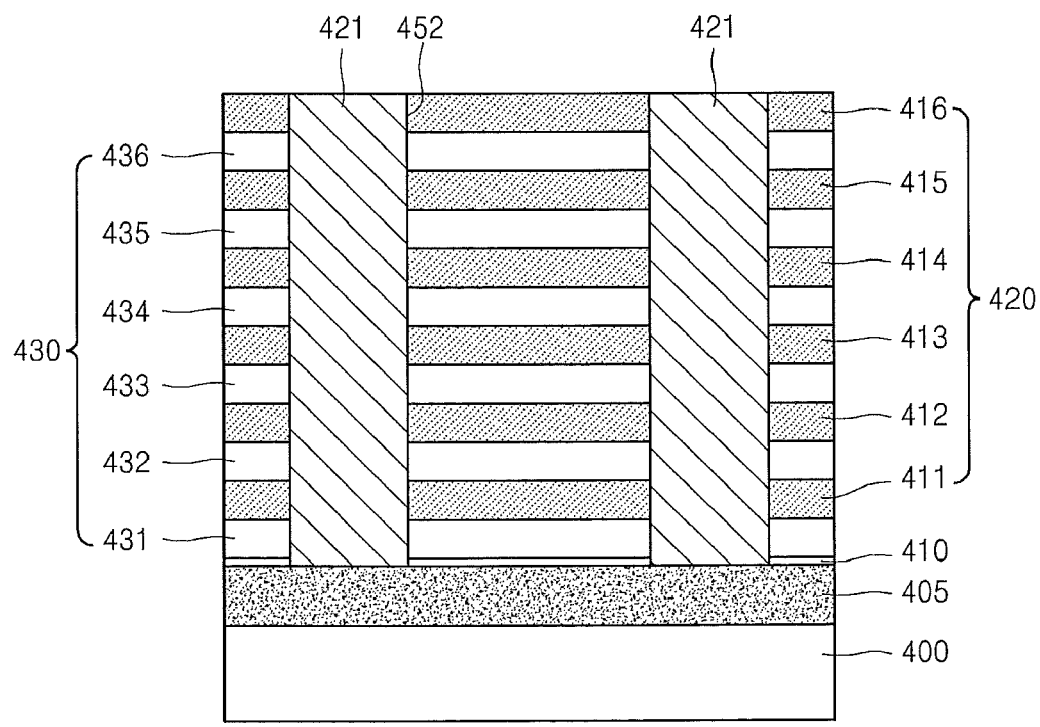
FIGS. 16 through 20 are cross-sectional views illustrating a method of forming a semiconductor structure, according to an embodiment of the inventive concept.

Referring to FIG. 16, a first preliminary semiconductor material layer 421 may be formed to fill each of the first openings 452 of the stack structure 450. The first preliminary semiconductor material layer 421 may be formed of an amorphous silicon layer or a crystalline silicon layer. The first preliminary semiconductor material layer 421 may be formed using a CVD process. During the CVD process, the first preliminary semiconductor material layer 421 may be doped with N-type impurities by using an in-situ doping process.

Figure 17:
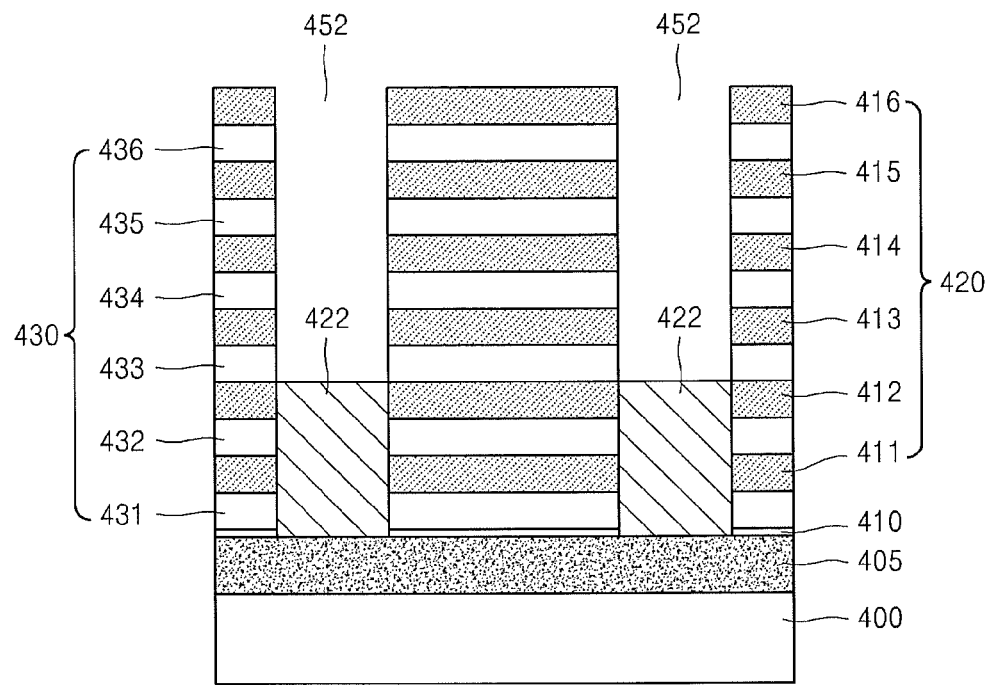

Referring to FIG. 17, the first preliminary semiconductor material layer 421 may be etched back, thereby forming a first preliminary semiconductor layer 422 only in partial regions of the first openings 452 of the stack structure 450. The first preliminary semiconductor layer 422 may be formed to one of various heights. The first preliminary semiconductor layer 422 may be formed to a height to which the ground selection transistor is formed.

Figure 18:
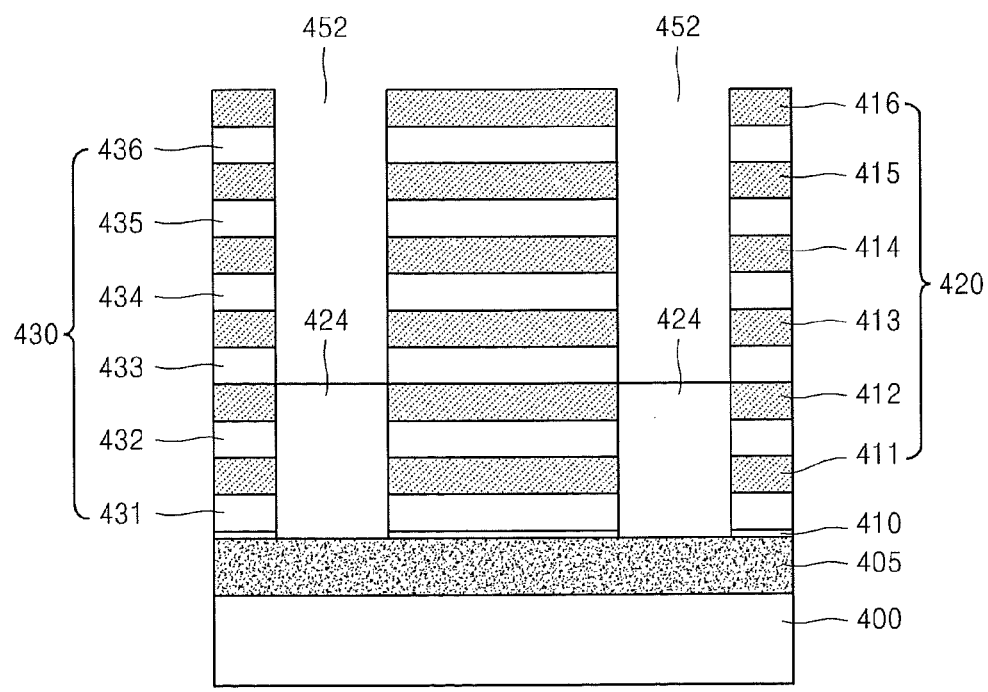

Referring to FIG. 18, the first preliminary semiconductor layer 422 may be primarily phase-changed, thereby forming a first single crystalline semiconductor layer 424 in the partial regions of the first openings 452. The formation of the first single crystalline semiconductor layer 424 may include phase-changing the first preliminary semiconductor layer 422 by using an annealing process, for example, a laser-induced epitaxial growth (LEG) process, a solid-phase epitaxy (SPE) process, or a metal induced crystallization (MIC) process using a metal catalyst. The annealing process may be performed using laser beams or a furnace. The annealing process may be performed using a furnace at a temperature of about 600 to about 700 degrees Centigrade for several hours so that amorphous silicon may be phase-changed into single crystalline silicon.

Laser beams used during the LEG process may be irradiated at such an energy density as to completely melt the first preliminary semiconductor layer 422. More specifically, the first preliminary semiconductor layer 422 may be melted with irradiation of laser beams so that amorphous silicon or crystalline silicon may be changed from a solid phase to a liquid phase. In particular, the top surface of the first preliminary semiconductor layer 422 through the top surface of the substrate 400 disposed at the bottom surfaces of the first openings 452 may be phase-changed into a liquid phase. In this case, laser beams may be irradiated at a temperature of about 1,410 degrees Centigrade, which is a melting point of silicon.

Thus, single crystals of the substrate 400 may function as seeds in the liquidized amorphous or crystalline silicon. As a result, the first preliminary semiconductor layer 422 may be changed into a single crystalline structure. For example, an excimer laser, which is a kind of gas laser, may be used as a laser-beam irradiation member. Also, the laser-beam irradiation member may have a scannable structure to enable irradiation of laser beams in a short amount of time.

During the phase-change of the first preliminary semiconductor layer 422 with the irradiation of laser beams, the substrate 400 may be heated to reduce a temperature gradient in a phase-changed region. Thus, in the present embodiment, the substrate 400 may be heated to a temperature of about 400 degrees Centigrade during the irradiation of laser beams. Accordingly, the first preliminary semiconductor layer 422 may be changed into a single crystalline silicon structure with the irradiation of laser beams, thereby forming the first single crystalline semiconductor layer 424.

Figure 19:
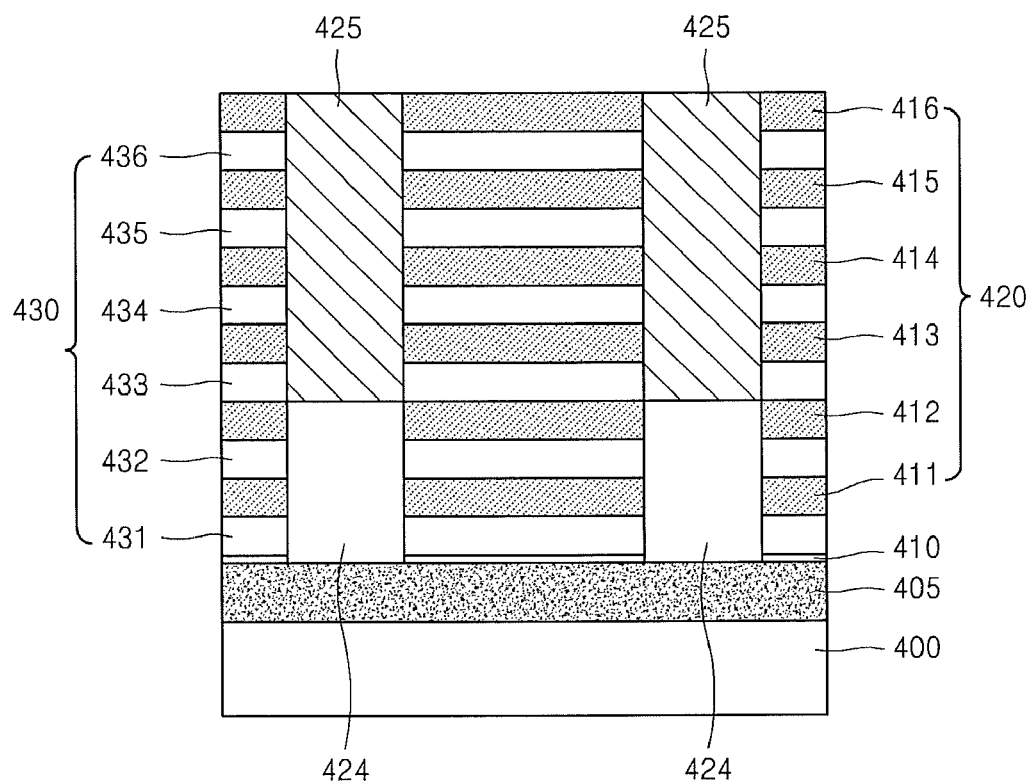
Figure 20:
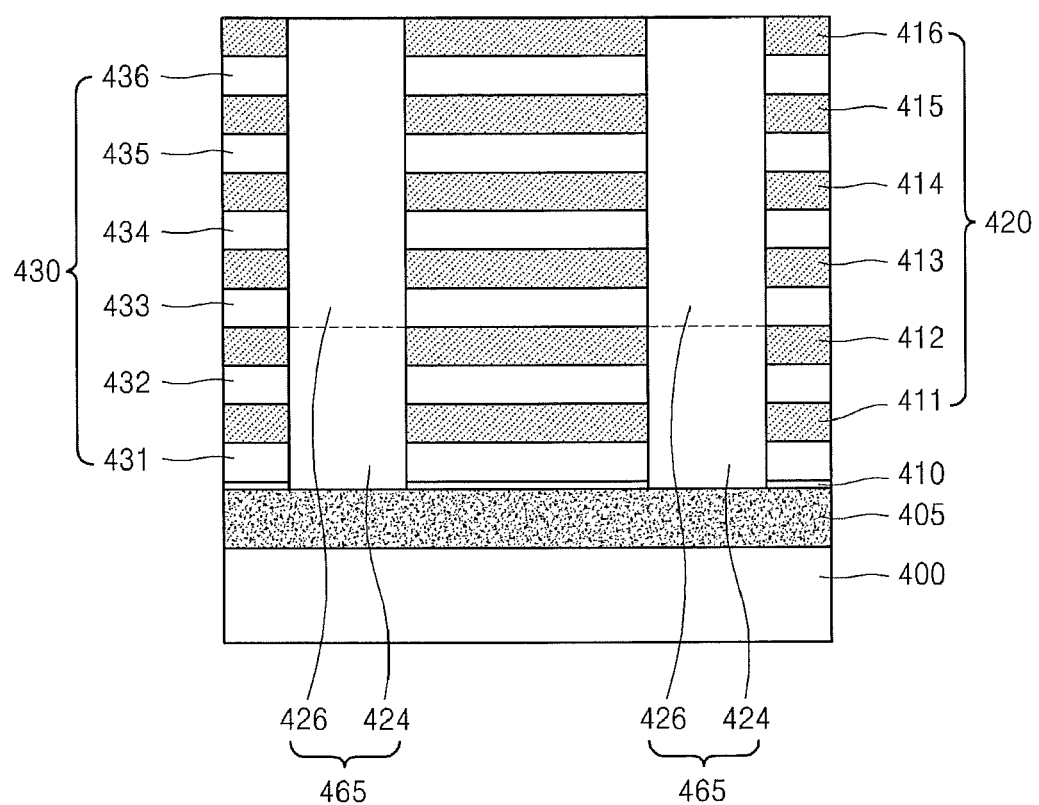

Referring to FIGS. 19 and 20, a second preliminary semiconductor layer 425 may be formed on the first single crystalline semiconductor layer 424 by filling the openings 452. The second preliminary semiconductor layer 425 may be formed of the same material as the first preliminary semiconductor layer 422.

The second preliminary semiconductor layer 425 may be secondarily phase-changed to form a second single crystalline semiconductor layer 426. Thus, the first and second single crystalline semiconductor layers 424 and 426 may combine into a cylindrical or pillar-type single crystalline semiconductor layer 465, thereby completing the semiconductor structure 455. The second preliminary semiconductor layer 425 may be phase-changed using the same process as the first preliminary semiconductor layer 422. Even if the single crystalline semiconductor layer 465 according to the inventive concept is formed in the openings 452 with a high aspect ratio, the single crystalline semiconductor layer 465 is formed using two phase-change processes, so that defects, such as voids, may not be formed in the single crystalline semiconductor layer 465.

A method of forming a semiconductor structure according to another embodiment of the inventive concept, will now be described with reference to FIGS. 21 through 25. In FIGS. 21 through 25, a shielding layer 440 is omitted for brevity. The semiconductor structure of the present embodiment may be the same as the semiconductor structure 455 of the previous embodiment, except that a single crystalline semiconductor layer 465a is formed only on sidewalls in the openings.

Figure 21:
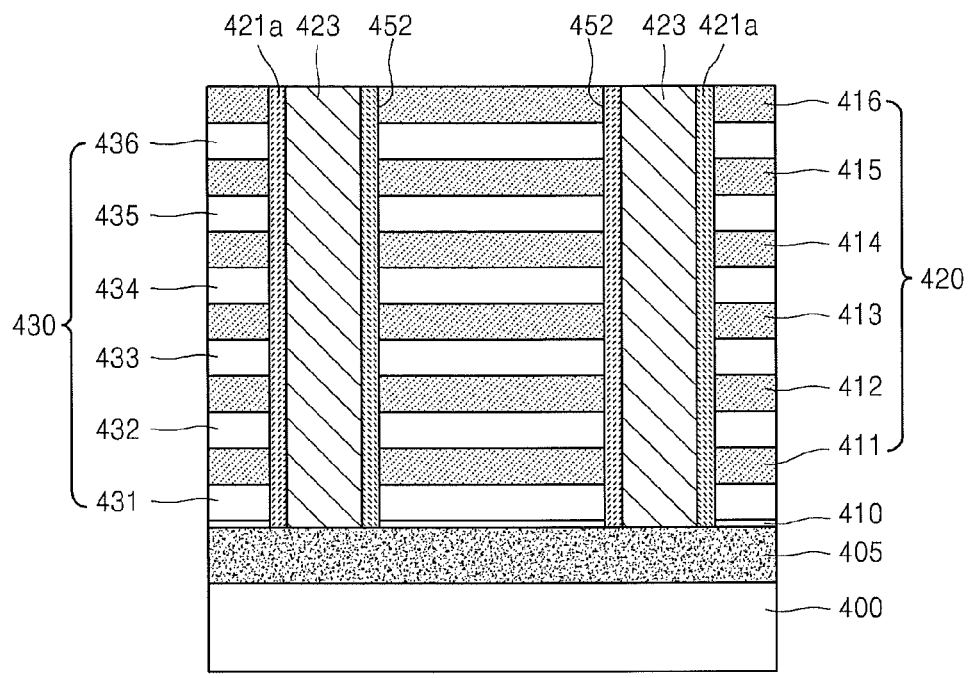
FIGS. 21 through 25 are cross-sectional views illustrating a method of forming a semiconductor structure, according to another embodiment of the inventive concept.

Referring to FIG. 21, a first preliminary semiconductor material layer 421a may be formed on a sidewall of a stack structure 450. The first preliminary semiconductor material layer 421a may be formed of the same material as the first preliminary semiconductor material layer 421 described in reference to the other embodiments according to the inventive concept herein. In other words, the first preliminary semiconductor material layer 421a may be formed of an amorphous silicon layer or a crystalline silicon layer. The first preliminary semiconductor material layer 421a may be formed using a CVD process. During the CVD process, the first preliminary semiconductor material layer 421a may be doped with N-type impurities by using an in-situ doping process. Thereafter, an insulating layer 423 may be formed to fill first openings 452.

Figure 22:
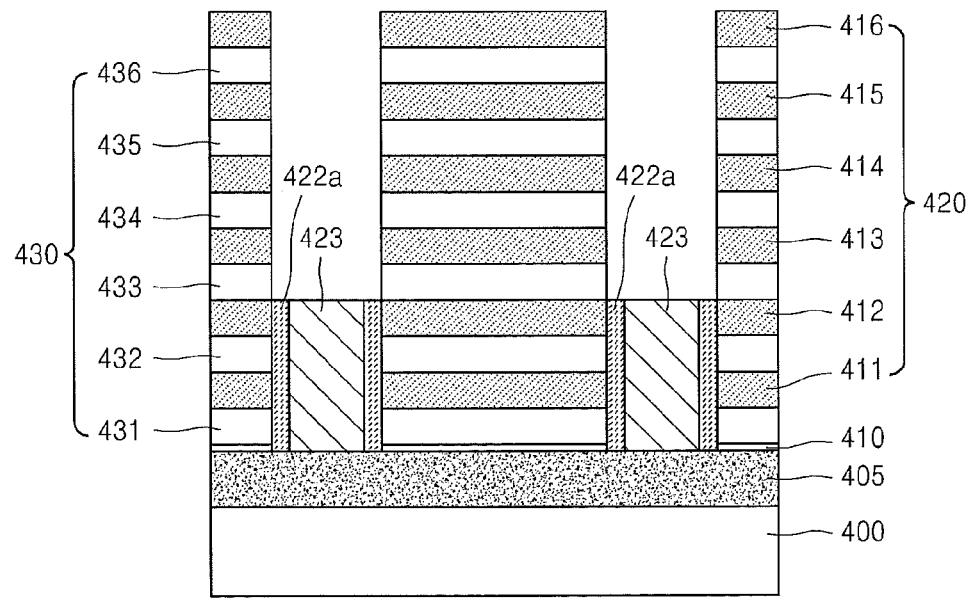

Referring to FIG. 22, the first preliminary semiconductor material layer 421a and the first insulating layer 423 may be etched back, thereby forming a first preliminary semiconductor layer 422a only in partial regions of the first openings 452 of the stack structure 450. The first preliminary semiconductor layer 422a may be formed to one of various heights. The first preliminary semiconductor layer 422a may be formed to a height to which a ground selection transistor is formed.

Figure 23:
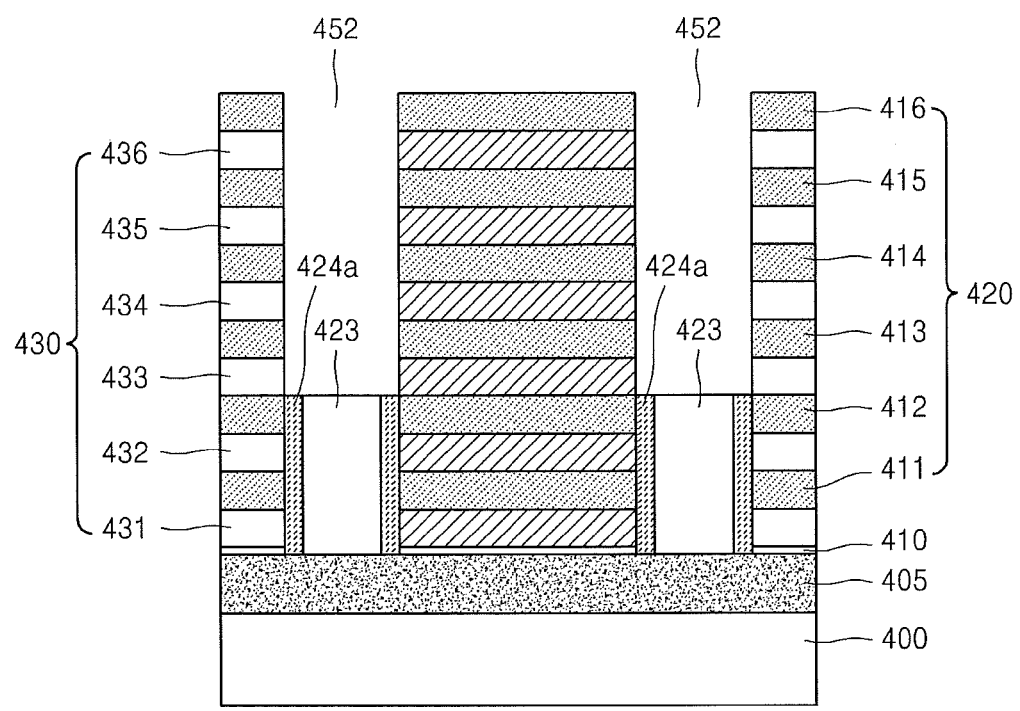

Referring to FIG. 23, the first preliminary semiconductor layer 422a may be primarily phase-changed to form a first single crystalline semiconductor layer 424a in the partial regions of the first openings 452. Since the process of primarily phase-changing the first preliminary semiconductor layer 422a is the same as the process of primarily phase-changing the first preliminary semiconductor layer 422, a description thereof will be omitted.

Figure 24:
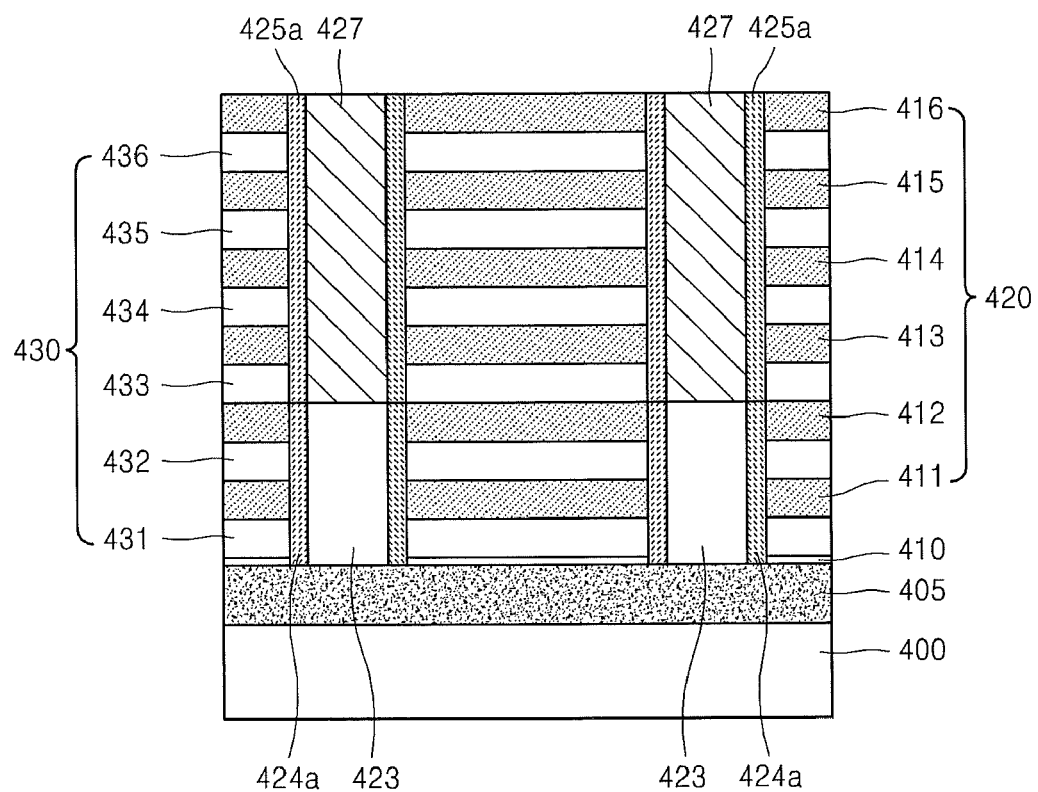

Referring to FIG. 24, a second preliminary semiconductor layer 425a may be formed on the first single crystalline semiconductor layer 424a, along sidewalls of the first openings 452. The second preliminary semiconductor layer 425a may be formed of the same material as the first preliminary semiconductor layer 422a. Thereafter, a second insulating layer 427 may be formed to fill the first openings 452.

Figure 25:
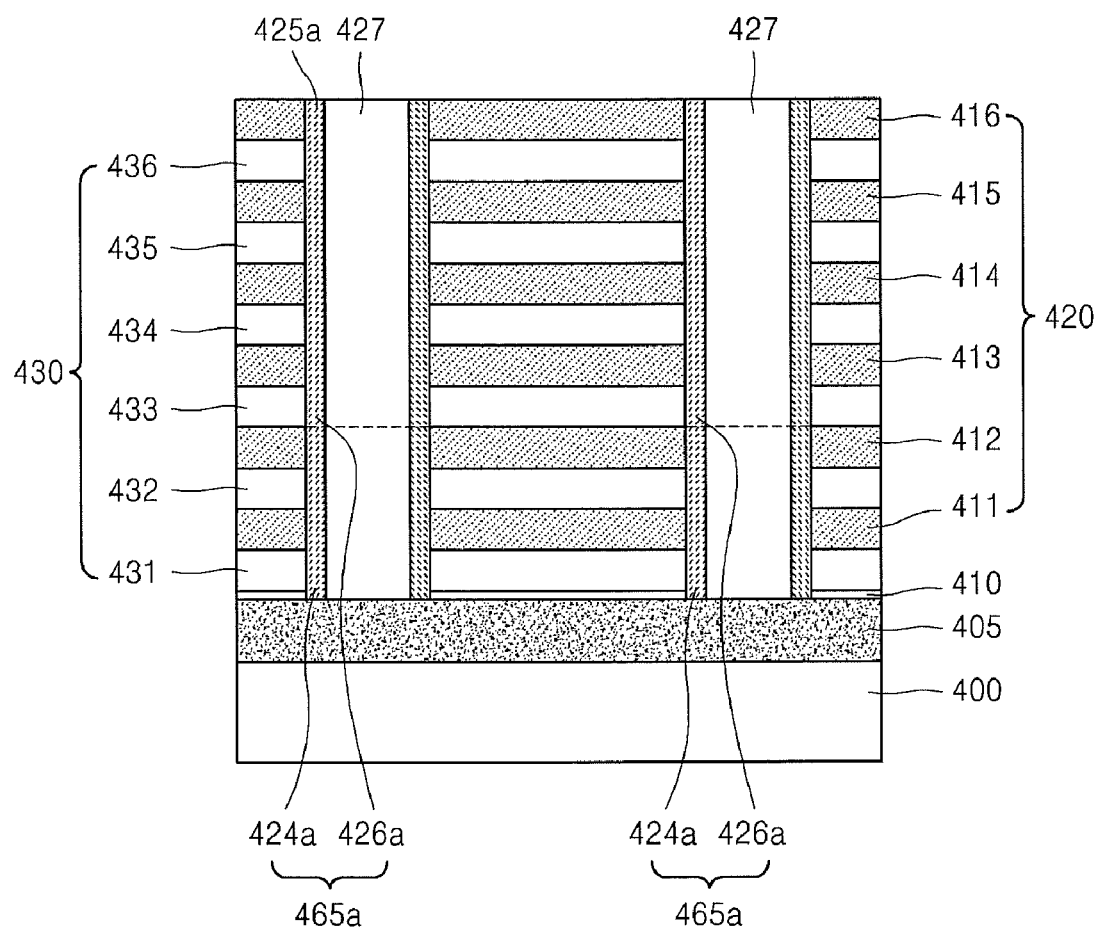

Referring to FIG. 25, the second preliminary semiconductor layer 425a may be secondarily phase-changed, thereby forming a second single crystalline semiconductor layer 426a. The first and second single crystalline semiconductor layers 424a and 426a may combine into a cylindrical or pillar-type single crystalline semiconductor layer 465a, thereby completing the semiconductor structure. The second preliminary semiconductor layer 425a may be phase-changed using the same process as that for the first preliminary semiconductor layer 422a. Even if the single crystalline semiconductor layer 465a of the semiconductor structure of the inventive concept is formed in openings with a high aspect ratio, the single crystalline semiconductor layer 465a may be formed in a two phase-change process, so that defects, such as voids, may not be formed in the single crystalline semiconductor layer 465a.

Hereinafter, a vertical non-volatile semiconductor memory device according to another embodiment of the inventive concept will be partially described. The following embodiment is only an example, and, the inventive concept may be variously applied.

Figure 26:
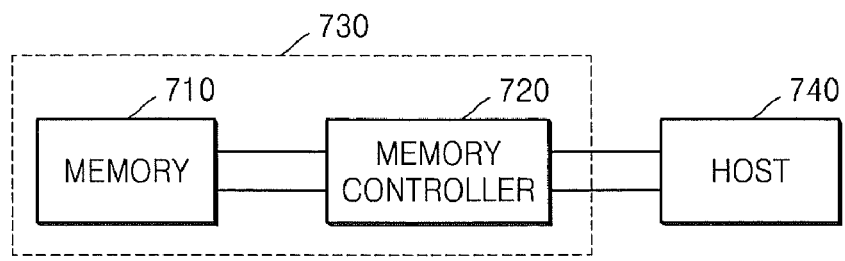
FIG. 26 is a block diagram of a vertical non-volatile semiconductor memory device according to another embodiment of the inventive concept.

FIG. 26 is a block diagram of a vertical non-volatile semiconductor memory device according to another embodiment of the inventive concept.

Specifically, the vertical non-volatile semiconductor memory device of the inventive concept may be applied to a memory card 730. The memory card 730 may include a memory 710 and a memory controller 720. The memory controller 720 and the memory 710 may exchange electric signals. For example, the memory 710 and the memory controller 720 may transmit and receive data in response to commands of a host 740. Thus, the memory card 730 may store data in the memory 710 or externally output data from the memory 710.

For example, the memory 710 may include a vertical non-volatile semiconductor memory device according to the inventive concept. The memory card 730 may be used as a data storage medium for various portable apparatuses. For example, the memory card 730 may include a memory stick card, a smart media (SM) card, a secure digital (SD) card, a mini secure digital (mini SD) card, or a multimedia card (MMC).

Figure 27:
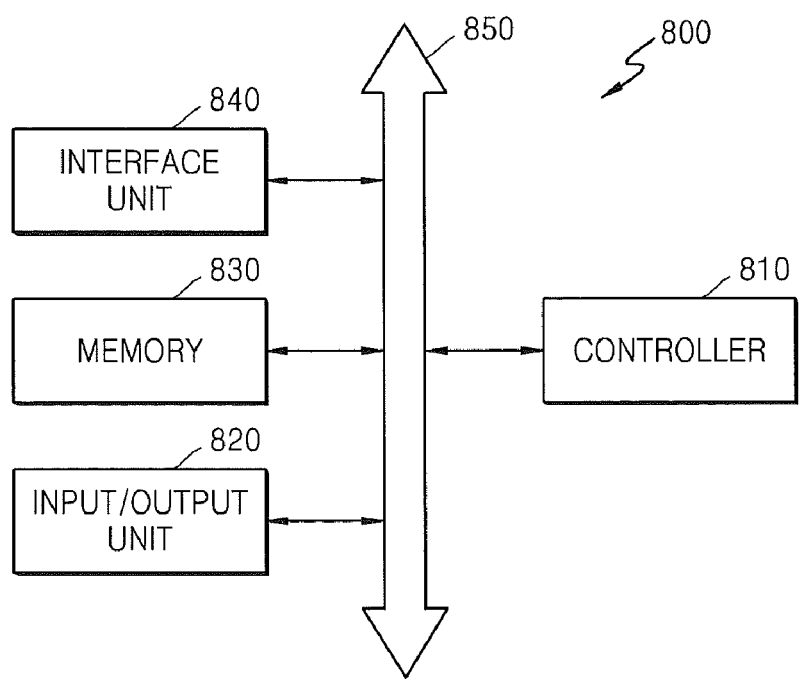
FIG. 27 is a block diagram of an electronic system according to an embodiment of the inventive concept.

FIG. 27 is a block diagram of an electronic system 800 according to an embodiment of the inventive concept.

Specifically, the electronic system 800 may include a controller 810, an input/output (I/O) unit 820, a memory 830, and an interface unit 840, which may transmit and receive data using a bus 850. The controller 810 may execute a program and control the electronic system 800. The I/O unit 820 may be used to input or output data to or from the electronic system 800.

The electronic system 800 may be connected to an external apparatus, for example, a personal computer (PC) or a network, via the interface unit 840 and exchange data with the external apparatus. The memory 830 may store codes and data required for operation of the controller 810. For example, the memory 830 may include a vertical non-volatile semiconductor memory device according to the inventive concept.

The electronic system 800 may constitute one of various electronic control apparatuses that may use the memory 830. For example, the electronic system 800 may be applied to mobile phones, MP3 players, navigations, solid state disks (SSDs), or household appliances.

While the inventive concept has been particularly shown and described with reference to embodiments thereof, it will be understood that various changes in form and details may be made therein without departing from the spirit and scope of the following claims.

What is claimed is:

1. A method of fabricating a vertical non-volatile semiconductor device, comprising:
forming a stack structure on a substrate, the stack structure having openings exposing a top surface of the substrate;
forming a first preliminary semiconductor layer to partially fill the openings;
phase-changing the first preliminary semiconductor layer to form a first single crystalline semiconductor layer in the openings;
forming a second preliminary semiconductor layer on the first single crystalline semiconductor layer; and
phase-changing the second preliminary semiconductor layer to form a second single crystalline semiconductor layer that combines with the first single crystalline semiconductor layers to form a single crystalline semiconductor layer in the openings.

2. The method of claim 1, wherein the forming of the first preliminary semiconductor layer comprises:
forming a first preliminary semiconductor material layer to fill the openings; and
etching back the first preliminary semiconductor material layer into the openings.

3. The method of claim 2, further comprising forming an insulating layer in the openings.

4. The method of claim 1, wherein the second preliminary semiconductor layer is formed on the first single crystalline semiconductor layer to fill the openings.

5. The method of claim 1, wherein phase-changing the first preliminary semiconductor layer and phase-changing the second preliminary semiconductor layer comprise applying heat to the first and second preliminary semiconductor layers via a furnace or laser light.

6. The method of claim 1, wherein each of the first and second preliminary semiconductor layers comprises a crystalline silicon layer or an amorphous silicon layer.

7. The method of claim 1, wherein the first preliminary semiconductor layer and the first single crystalline semiconductor layer are formed on sidewalls of the openings of the stack structure formed on the substrate.

8. The method of claim 7, wherein the second preliminary semiconductor layer and the second single crystalline semiconductor layer are formed on sidewalls of the openings on the first preliminary semiconductor layer and the first single crystalline semiconductor layer.

9. A method of fabricating a vertical non-volatile semiconductor device, comprising:
forming a stack structure on a substrate, the stack structure including openings exposing a top surface of the substrate;
forming a first preliminary semiconductor layer to partially fill the openings;
phase-changing the first preliminary semiconductor layer to form a first single crystalline semiconductor layer in the openings;
forming a second preliminary semiconductor layer on the first single crystalline semiconductor layer in the openings;
phase-changing the second preliminary semiconductor layer to form a second single crystalline semiconductor layer that combines with the first single crystalline semiconductor layers to form a single crystalline semiconductor layer in the openings; and
forming transistors on sidewalls of the single crystalline semiconductor layer.

10. The method of claim 9, wherein forming the first preliminary semiconductor layer comprises:
forming a first preliminary semiconductor material layer to fill the openings; and
etching back the first preliminary semiconductor material layer into the openings.

11. The method of claim 9, wherein the first preliminary semiconductor layer is formed on sidewalls of the openings, on the substrate,
the method further comprising forming an insulating layer in the openings.

12. The method of claim 9, wherein the second preliminary semiconductor layer is formed on sidewalls of the openings, on the first single crystalline semiconductor layer,
the method further comprising forming an insulating layer in the openings, on the first single crystalline semiconductor layer.

13. The method of claim 9, wherein phase-changing the first preliminary semiconductor layer and phase-changing the second preliminary semiconductor layer comprise applying heat to the first and second preliminary semiconductor layers using a furnace or laser light.

14. The method of claim 9, wherein the forming of the stack structure comprises:
repeating sequentially forming a sacrificial layer and an interlayer insulating layer on the substrate a plurality of times so that the sacrificial layers and interlayer insulating layers are alternately stacked; and
anisotropically etching partial regions of the stacked layers to form sacrificial patterns and interlayer insulating patterns having the openings exposing the top surface of the substrate.

15. The method of claim 14, further comprising forming a shielding layer between the sacrificial layer and the interlayer insulating layer to block charges from spreading.

16. The method of claim 14, further comprising: before forming the transistors,
partially etching the stack structure between the single crystalline semiconductor layers to form second openings exposing the top surface of the substrate; and
etching the respective sacrificial patterns exposed at a sidewall of the second openings to form concave portions exposing first lateral surfaces of the interlayer insulating patterns and the single crystalline semiconductor layer.

17. The method of claim 16, wherein the forming of the transistors comprises:
forming a tunnel insulating layer in the concave portions; and
forming a charge storage layer, a blocking insulating layer, and gate patterns on the tunnel insulating layer.

18. A method of fabricating a vertical NAND semiconductor device, comprising:
changing a phase of a first preliminary semiconductor layer in an opening from solid to liquid to form a first single crystalline semiconductor layer in the opening; and then
forming a second preliminary semiconductor layer on the first single crystalline semiconductor layer; and
changing a phase of the second preliminary semiconductor layer from solid to liquid to form a second single crystalline semiconductor layer that combines with the first single crystalline semiconductor layers to form a single crystalline semiconductor layer in the opening.

19. The method according to claim 18 wherein changing a phase comprises heating the first or second preliminary semiconductor layer to a melting point of silicon using laser light.

20. The method according to claim 18 wherein changing a phase comprises heating the first or second preliminary semiconductor layer in a furnace at a temperature of about 600 to about 700 degrees Centigrade for several hours.

* * * * *